(12) United States Patent
Kim et al.

(10) Patent No.: US 10,790,595 B2
(45) Date of Patent: Sep. 29, 2020

(54) ANTENNA MODULE AND MANUFACTURING METHOD THEREOF

(71) Applicant: SAMSUNG ELECTRONICS CO., LTD., Suwon-si (KR)

(72) Inventors: Doo Il Kim, Suwon-si (KR); Young Sik Hur, Suwon-si (KR); Yong Ho Baek, Suwon-si (KR); Jin Seon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/949,386

(22) Filed: Apr. 10, 2018

(65) Prior Publication Data

US 2019/0173184 A1    Jun. 6, 2019

(30) Foreign Application Priority Data

Dec. 6, 2017    (KR) .................... 10-2017-0166855

(51) Int. Cl.
*H01Q 9/04* (2006.01)
*H01Q 21/06* (2006.01)
(Continued)

(52) U.S. Cl.
CPC ..... *H01Q 21/065* (2013.01); *G06K 19/07775* (2013.01); *H01Q 1/2283* (2013.01);
(Continued)

(58) Field of Classification Search
CPC ... H01Q 1/2283; H01Q 9/0407; H01Q 21/065
See application file for complete search history.

(56) References Cited

U.S. PATENT DOCUMENTS

| 9,153,863 B2* | 10/2015 | Nair | .................. H01Q 1/38 |
| 9,711,465 B2* | 7/2017 | Liao | ................. H01L 23/66 |

(Continued)

FOREIGN PATENT DOCUMENTS

| JP | 2006-101494 A | 4/2006 |
| JP | 2013-105992 A | 5/2013 |

(Continued)

OTHER PUBLICATIONS

Office Action issued in corresponding Korean Application No. 10-2017-0166855, dated Feb. 18, 2019.
(Continued)

*Primary Examiner* — Ab Salam Alkassim, Jr.
(74) *Attorney, Agent, or Firm* — Sughrue Mion, PLLC

(57) ABSTRACT

An antenna module includes a connection member, an integrated circuit (IC), a dielectric layer, antenna members, feed vias, and a plating member. The connection member includes one or more wiring layer(s) and insulating layer(s). The IC is disposed on one surface of the connection member and is electrically connected to the wiring layer(s). The dielectric layer is disposed on another surface of the connection member. The antenna members are disposed in the dielectric layer, and the feed vias are disposed in the dielectric layer so that each has one end electrically connected to a corresponding antenna member and the other end electrically connected to a corresponding one of the wiring layer(s). The plating member is disposed in the dielectric layer to surround side surfaces of the feed vias. The dielectric layer has a dielectric constant Dk greater than that of at least one insulating layer.

19 Claims, 24 Drawing Sheets

(51) Int. Cl.
  *H01Q 23/00* (2006.01)
  *G06K 19/077* (2006.01)
  *H01Q 1/38* (2006.01)
  *H01Q 1/22* (2006.01)

(52) U.S. Cl.
  CPC ............ *H01Q 1/38* (2013.01); *H01Q 9/0407* (2013.01); *H01Q 23/00* (2013.01)

(56) References Cited

U.S. PATENT DOCUMENTS

| | | | | |
|---|---|---|---|---|
| 10,319,688 | B2* | 6/2019 | Wolter | H01L 23/552 |
| 10,347,598 | B2* | 7/2019 | Baek | H01L 24/13 |
| 10,511,080 | B2* | 12/2019 | So | H01L 24/25 |
| 10,594,019 | B2* | 3/2020 | Baks | H01Q 9/0407 |
| 2011/0187602 | A1* | 8/2011 | Nair | C03C 3/068 |
| | | | | 343/700 MS |
| 2012/0007786 | A1 | 1/2012 | Ando et al. | |
| 2014/0110856 | A1* | 4/2014 | Lin | H01L 24/19 |
| | | | | 257/774 |
| 2014/0140031 | A1* | 5/2014 | Fujita | H01L 23/49816 |
| | | | | 361/803 |
| 2014/0145883 | A1* | 5/2014 | Baks | H01Q 1/2283 |
| | | | | 343/700 MS |
| 2015/0249283 | A1* | 9/2015 | Watanabe | H01Q 1/24 |
| | | | | 343/702 |
| 2015/0325925 | A1* | 11/2015 | Kamgaing | H01L 23/66 |
| | | | | 343/893 |
| 2016/0049723 | A1* | 2/2016 | Baks | H01L 23/49827 |
| | | | | 343/848 |
| 2016/0056544 | A1* | 2/2016 | Garcia | H01Q 21/28 |
| 2016/0240492 | A1* | 8/2016 | Wolter | H01L 23/552 |
| 2016/0276727 | A1* | 9/2016 | Dang | H01P 5/02 |
| 2017/0012359 | A1* | 1/2017 | Jung | H01Q 3/30 |
| 2018/0337148 | A1* | 11/2018 | Baek | H01L 23/66 |
| 2019/0027804 | A1* | 1/2019 | Kim | H01L 26/66 |
| 2019/0051989 | A1* | 2/2019 | Kim | H01L 24/20 |
| 2019/0089044 | A1* | 3/2019 | Kobuke | H01B 3/12 |
| 2019/0131224 | A1* | 5/2019 | Choi | H01L 24/18 |
| 2019/0139912 | A1* | 5/2019 | Kim | H01L 24/20 |
| 2019/0173176 | A1* | 6/2019 | Kim | H01Q 5/371 |
| 2019/0173195 | A1* | 6/2019 | Kim | H01Q 9/0414 |
| 2019/0198976 | A1* | 6/2019 | Kim | H01Q 1/243 |
| 2019/0207304 | A1* | 7/2019 | Kim | H01Q 9/045 |
| 2019/0221917 | A1* | 7/2019 | Kim | H01Q 1/2283 |
| 2019/0279950 | A1* | 9/2019 | Kim | H01L 23/66 |
| 2019/0280374 | A1* | 9/2019 | Kim | H01L 23/5386 |
| 2019/0287938 | A1* | 9/2019 | Kim | H01L 25/16 |
| 2020/0020653 | A1* | 1/2020 | Lim | H01L 24/09 |
| 2020/0035607 | A1* | 1/2020 | Lee | H01L 23/5383 |
| 2020/0144697 | A1* | 5/2020 | Kim | H01L 24/19 |

FOREIGN PATENT DOCUMENTS

| | | | | |
|---|---|---|---|---|
| JP | 5527316 B2 | 4/2014 | | |
| KR | 10-2007-0046898 A | 5/2007 | | |
| KR | 10-2014-0005339 A | 1/2014 | | |
| WO | 2006/025972 A1 | 3/2006 | | |
| WO | 2012/151123 A2 | 11/2012 | | |
| WO | WO-2015130132 A1 * | 9/2015 | ............. | H01Q 3/30 |
| WO | 2017/167987 A1 | 10/2017 | | |

OTHER PUBLICATIONS

Communication dated May 31, 2019 issued by the Taiwan Intellectual Property Office in counterpart Taiwan Application No. 107112461.

* cited by examiner

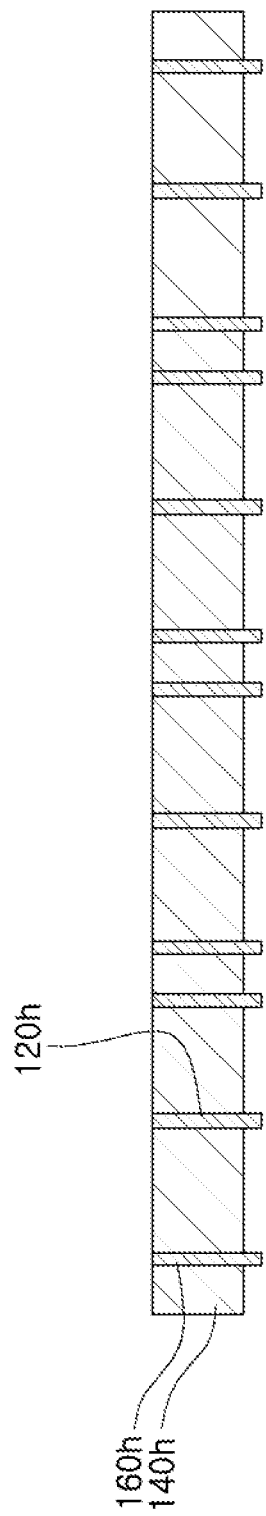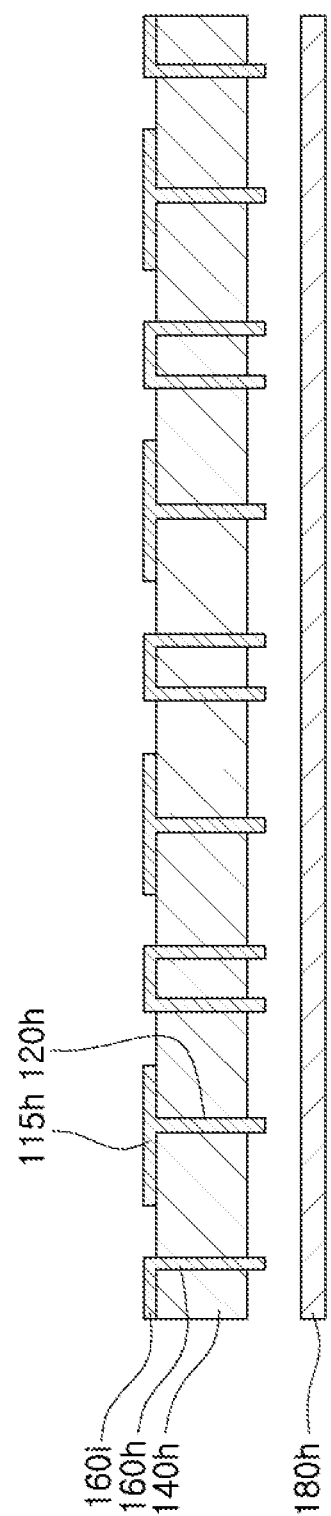

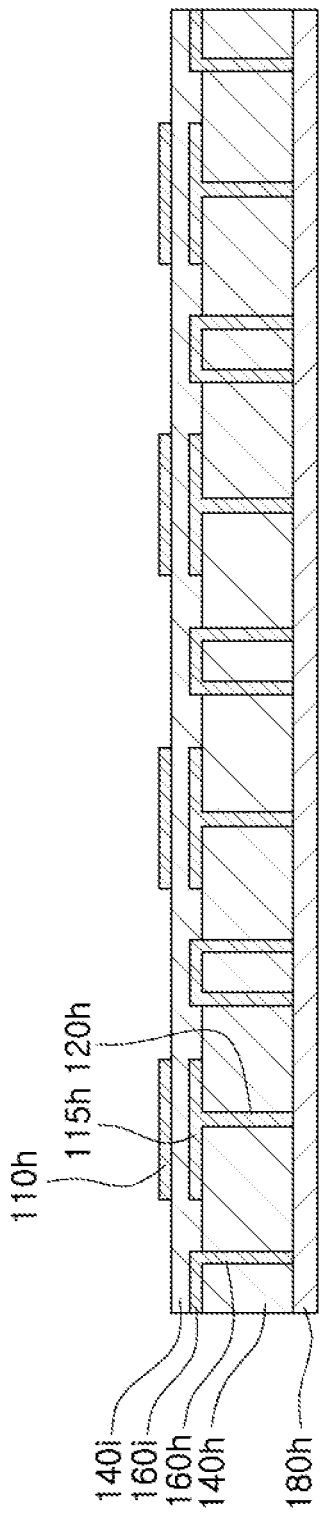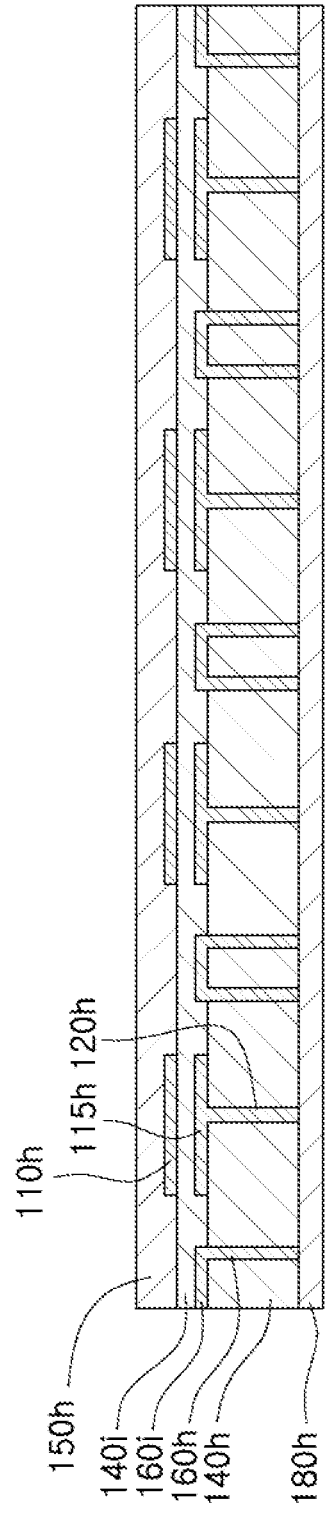

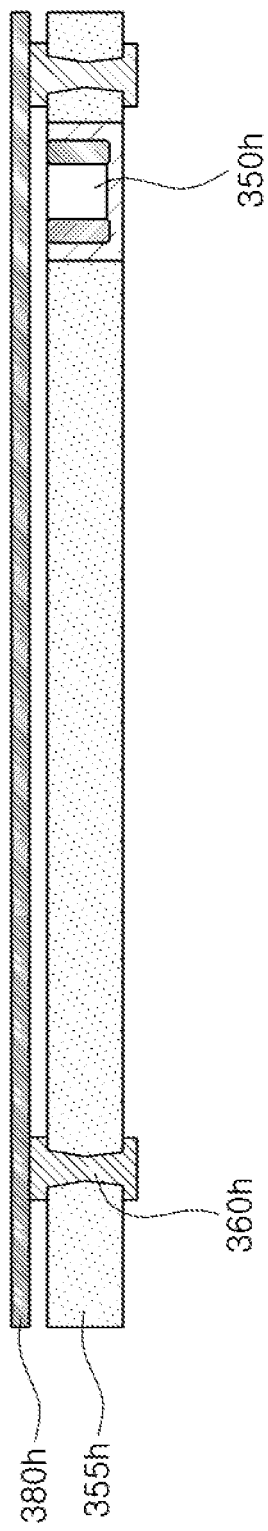
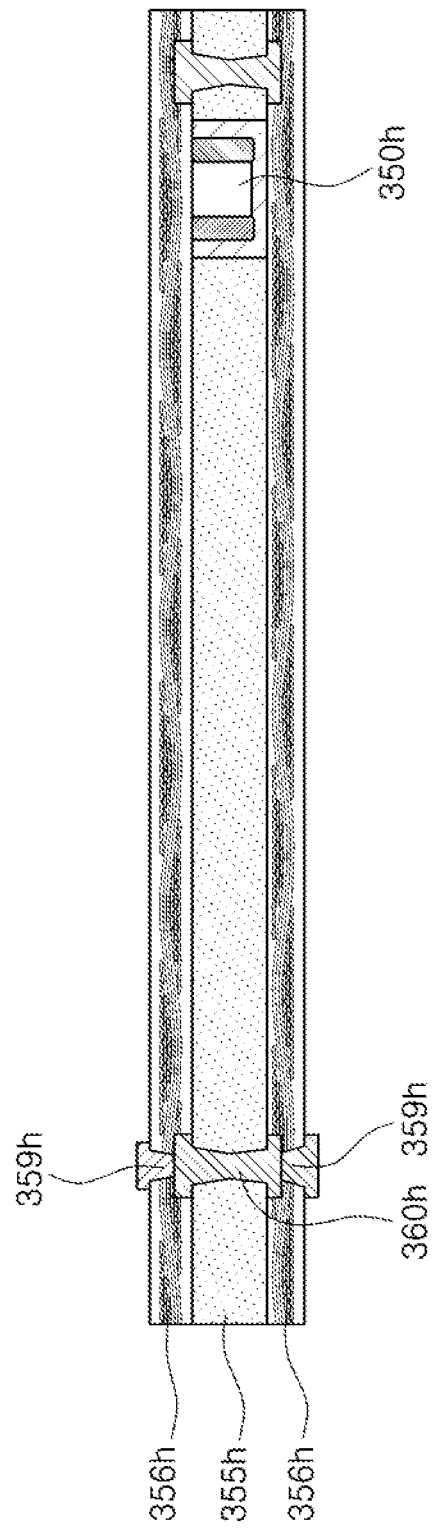
FIG. 9A
FIG. 9B

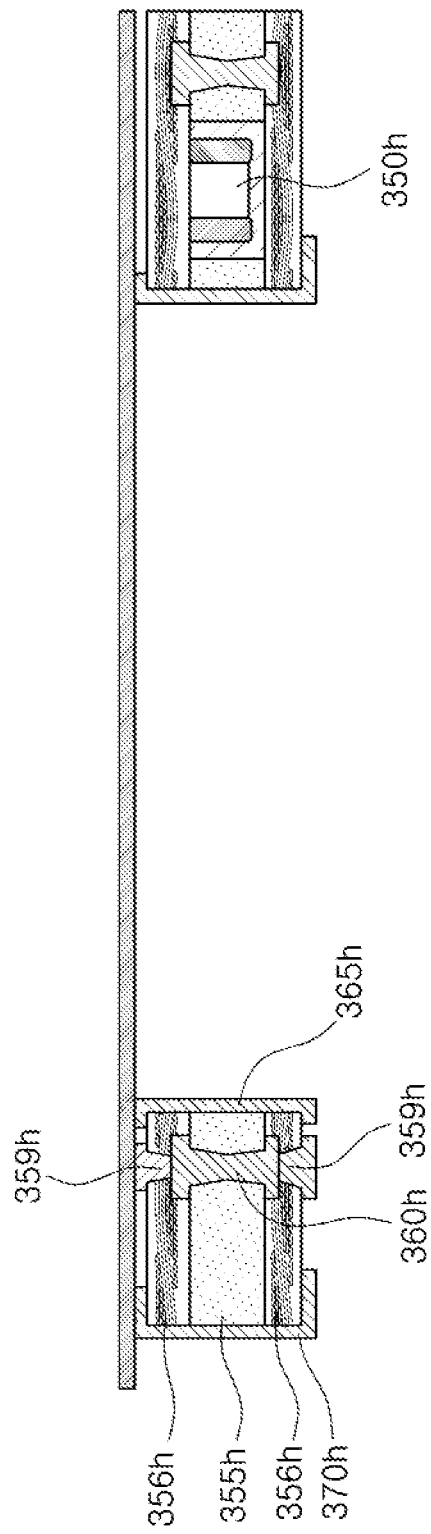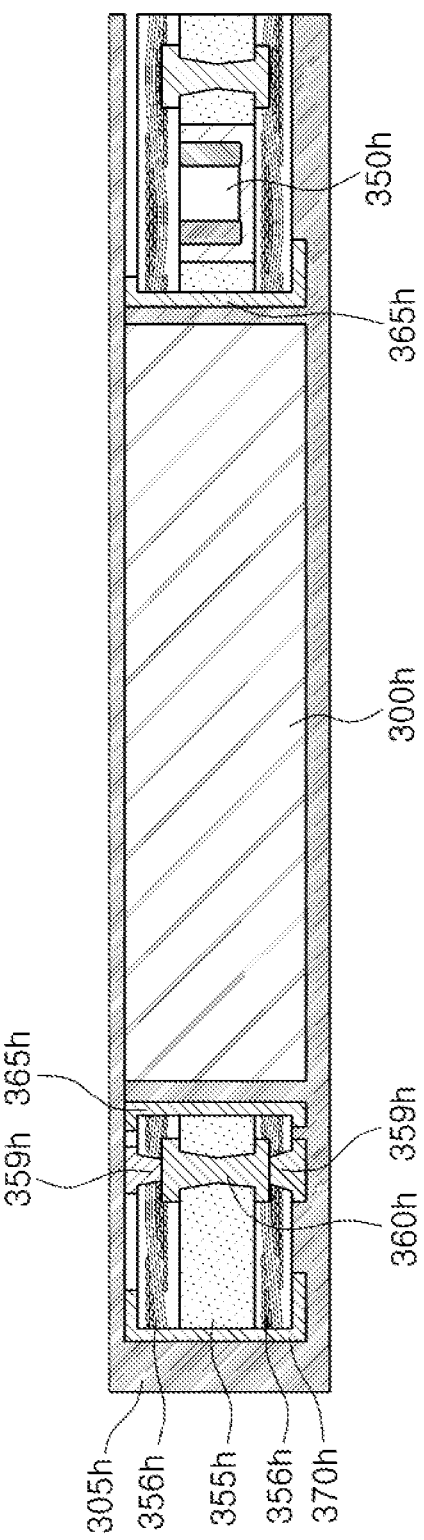

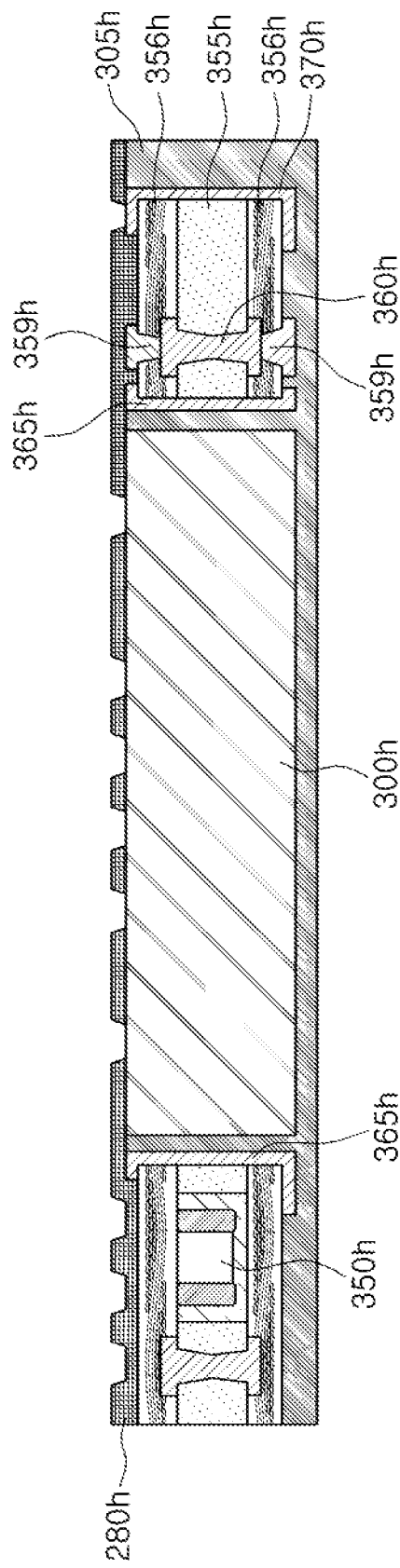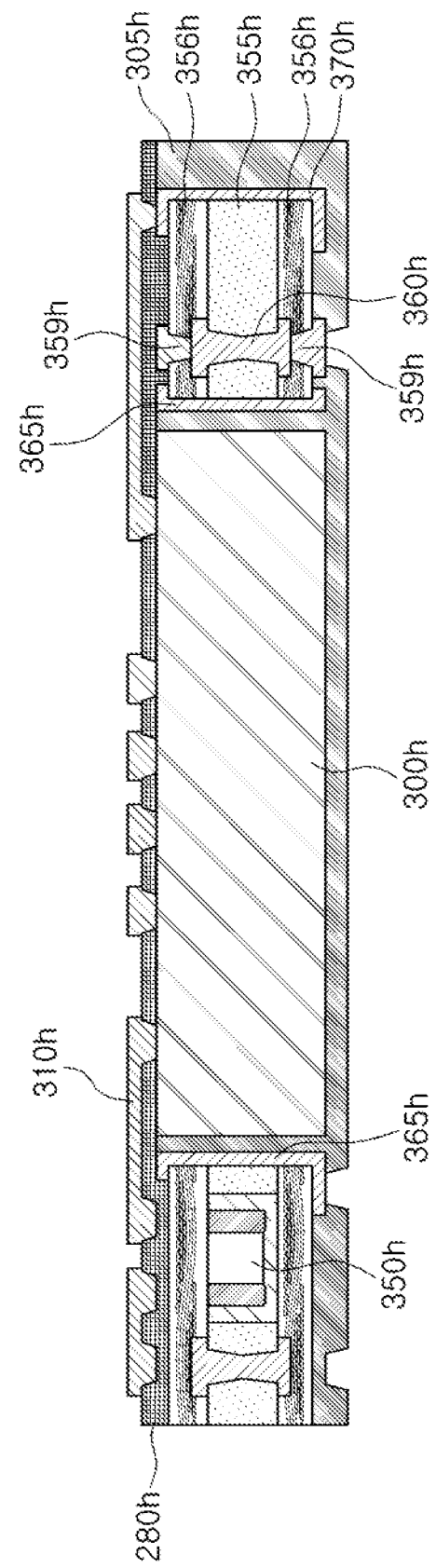

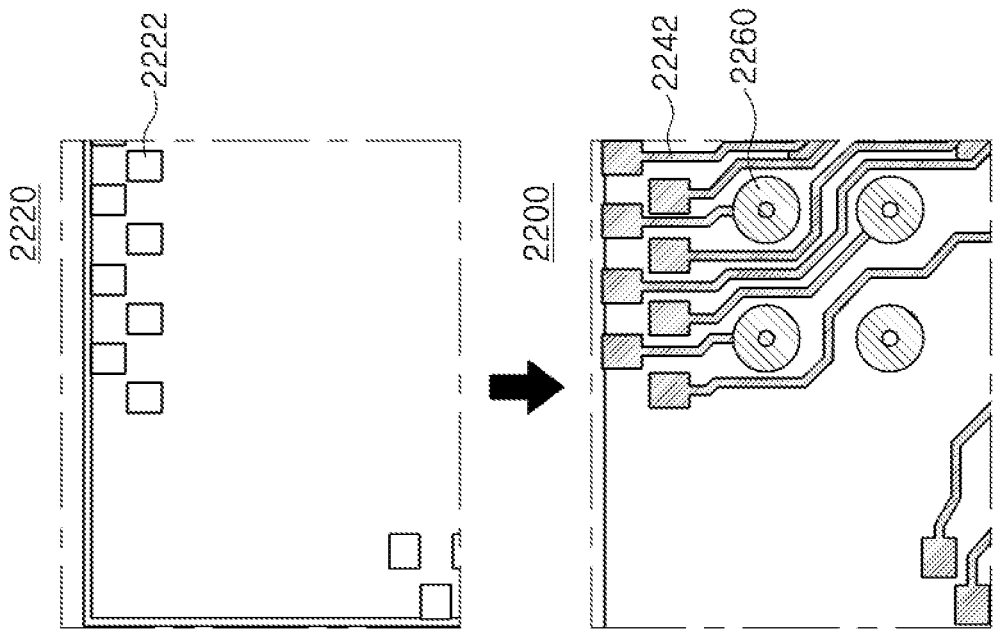
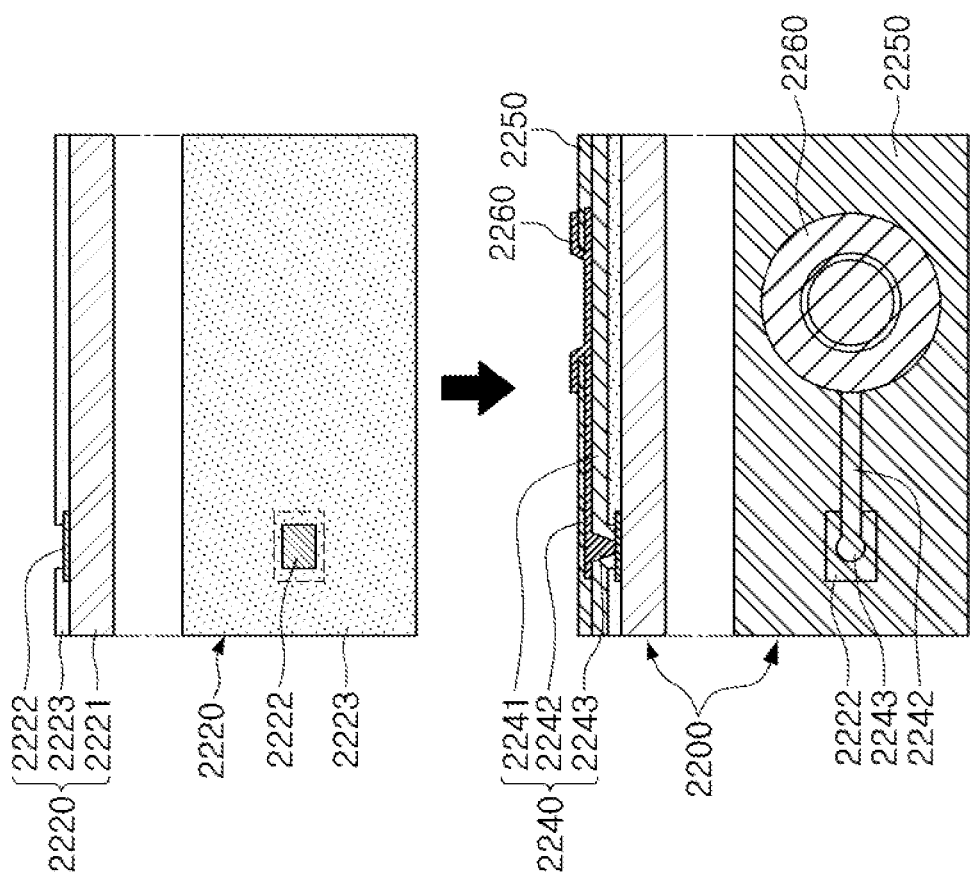
FIG. 16A
FIG. 16B

ANTENNA MODULE AND MANUFACTURING METHOD THEREOF

CROSS-REFERENCE TO RELATED APPLICATION(S)

This application claims benefit of priority to Korean Patent Application No. 10-2017-0166855 filed on Dec. 6, 2017 in the Korean Intellectual Property Office, the disclosure of which is incorporated herein by reference in its entirety.

BACKGROUND

1. Field

The present disclosure relates to an antenna module and a manufacturing method thereof.

2. Description of Related Art

Recently, millimeter wave (mmWave) communications including 5th generation (5G) communications have been actively researched, and research into the commercialization of an antenna module able to smoothly implement millimeter wave communications is being actively undertaken.

Conventionally, an antenna module providing a millimeter wave communications environment uses a structure in which an integrated circuit (IC) and an antenna are disposed on a board and are connected to each other by a coaxial cable in order to satisfy a high level of antenna performance (e.g., a transmission and reception rate, a gain, directivity, and the like) while operation at a high frequency.

However, such a structure may cause a shortage of antenna layout space, a restriction of the degree of freedom of an antenna shape, an increase in interference between the antenna and the IC, and an increase in the size and cost of the antenna module.

SUMMARY

An aspect of the present disclosure may provide an antenna module easily miniaturized while improving transmission and reception performance of a radio frequency (RF) signal using a dielectric layer providing an environment capable of easily securing antenna performance, and a manufacturing method thereof.

According to an aspect of the present disclosure, an antenna module may include a connection member, an integrated circuit (IC), a dielectric layer, a plurality of antenna members, a plurality of feed vias, and a plating member. The connection member includes at least one wiring layer and at least one insulating layer. The integrated circuit (IC) disposed on a first surface of the connection member and is electrically connected to the at least one wiring layer. The dielectric layer is disposed on a second surface of the connection member. The plurality of antenna members are each disposed in the dielectric layer and configured to transmit or receive a radio frequency (RF) signal. The plurality of feed vias are disposed in the dielectric layer so that one end of each feed via is electrically connected to a corresponding antenna member of the plurality of antenna members and another end of each feed via is electrically connected to a corresponding wire of the at least one wiring layer. The plating member is disposed in the dielectric layer to surround side surfaces of the plurality of feed vias. The dielectric layer has a dielectric constant Dk greater than a dielectric constant of at least one insulating layer.

According to another aspect of the present disclosure, a method of manufacturing an antenna module may include forming a plurality of feed vias each including a plating member extending through a dielectric layer, and disposing a plurality of antenna members on an upper surface of the dielectric layer at locations surrounding each of the plurality of feed vias. A connection member, including at least one wiring layer electrically connected to the plurality of feed vias and at least one insulating layer having a dielectric constant smaller than that of the dielectric layer, is disposed on a lower surface of the dielectric layer. An integrated circuit (IC) is electrically connected to the at least one wiring layer of the connection member on a lower surface of the connection member.

According to a further aspect of the present disclosure, an antenna module includes a dielectric layer and a connection member. The dielectric layer has a plurality of antenna members disposed therein, each antenna member being electrically connected to a respective feed via extending from the antenna member to a first surface of the dielectric layer. The connection member is disposed on the first surface of the dielectric layer, and includes an insulating material having a plurality of wiring layers extending therethrough and connected to each of the respective feed vias of the plurality of antenna members. The dielectric layer has a greater dielectric constant than the insulating material of the connection member.

BRIEF DESCRIPTION OF DRAWINGS

The above and other aspects, features and other advantages of the present disclosure will be more clearly understood from the following detailed description taken in conjunction with the accompanying drawings, in which:

FIGS. 7A through 7F are views illustrating an example of a manufacturing method of an antenna module according to an exemplary embodiment;

FIGS. 9A through 9G are views illustrating an example of a manufacturing method of an IC package of an antenna module according to an exemplary embodiment;

FIGS. 16A and 16B are a schematic cross-sectional view illustrating a fan-in semiconductor package before and after being packaged;

DETAILED DESCRIPTION

Hereinafter, exemplary embodiments will be described in detail with reference to the accompanying drawings.

Figure 1:
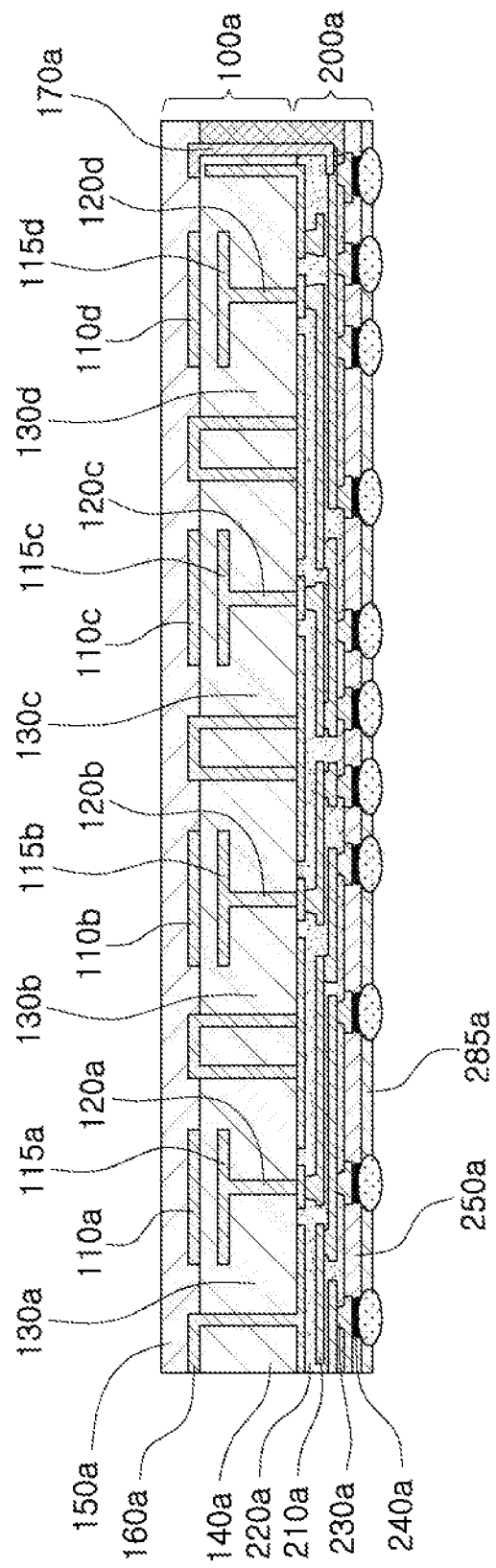
FIG. 1 is a view illustrating an example of an antenna module according to an exemplary embodiment.

FIG. 1 is a view illustrating an example of an antenna module according to an exemplary embodiment.

Referring to FIG. 1, an antenna module according to an exemplary embodiment may have a heterogeneous structure in which an antenna package 100a and a connection member 200a are coupled to each other. That is, the antenna module may be miniaturized while improving antenna performance (e.g., a transmission and reception rate, a gain, directivity, and the like) by utilizing both characteristics that are easy to improve the antenna performance of the antenna package 100a and characteristics that are easy to dispose a circuit pattern or an integrated circuit (IC) of the connection member 200a.

The connection member 200a may include at least one wiring layer 210a and at least one insulating layer 220a. The connection member 200a may further include a wiring via 230a connected to at least one wiring layer 210a, a connection pad 240a connected to the wiring via 230a, and passivation layers 250a and 285a and may have a structure similar to a copper redistribution layer (RDL). The antenna package 100a may be disposed on an upper surface of the connection member 200a.

The antenna package 100a may include a dielectric layer 140a disposed on an upper surface of the connection member 200a, a plurality of antenna members 115a, 115b, 115c, and 115d each disposed in the dielectric layer 140a and configured to transmit or receive an RF signal, and a plurality of feed vias 120a, 120b, 120c, and 120d in which one end of each thereof is electrically connected to a corresponding antenna member of the plurality of antenna members 115a, 115b, 115c, and 115d and the other end of each thereof is electrically connected to a corresponding wire of the at least one wiring layer 210a.

The antenna package 100a may be advantageous in terms of securing antenna performance as a height and/or a width of the dielectric layer 140a is large, but may be disadvantageous in terms of miniaturizing as a size (e.g., a height and a width) of the dielectric layer 140a is large.

The dielectric layer 140a may have a dielectric constant greater than a dielectric constant Dk of at least one insulating layer 220a. Accordingly, the antenna package 100a may be advantageous in terms of miniaturizing by reducing the size of the dielectric layer 140a needed in terms of securing the antenna performance, and the connection member 200a may reduce transmission loss of the RF signal by having a relatively small dielectric constant.

For example, the dielectric layer 140a and at least one insulating layer 220a may be formed of a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, Ajinomoto Build up Film (ABF), FR-4, Bismaleimide Triazine (BT), a photo imageable dielectric (PID) resin, generic copper clad laminate (CCL), or a glass or ceramic based insulating material.

For example, the dielectric layer 140a may be formed of glass, ceramic, or silicon having a large dielectric constant (e.g., 5 or more), and at least one insulating layer 220a may be formed of copper clad laminate (CCL) or prepreg having a relatively small dielectric constant (e.g., smaller than 5).

In addition, the dielectric layer 140a may have a height greater than that of at least one insulating layer 220a. Accordingly, the antenna package 100a may have boundary conditions (e.g., small manufacturing tolerance, a short electrical length, a smooth surface, a long straight line length of a feed via, and the like) advantageous in securing a radiation pattern.

Meanwhile, the antenna package 100a may further include a plurality of director members 110a, 110b, 110c, and 110d each disposed between a corresponding antenna member of the plurality of antenna members 115a, 115b, 115c, and 115d and an encapsulation member 150a on the dielectric layer 140a. The plurality of director members 110a, 110b, 110c, and 110d may provide a boundary condition to the corresponding antenna member so that a bandwidth of the corresponding antenna member is expanded. For example, the number of the plurality of director members 110a, 110b, 110c, and 110d may be zero or two or more depending on a bandwidth design standard or a size design standard of the antenna package 100a.

In addition, the antenna package 100a may further include an encapsulation member 150a disposed on the dielectric layer 140a. The encapsulation member 150a may improve durability for impact or oxidation of the plurality of antenna members 115a-115d and/or the plurality of director members 110a-110d. For example, the encapsulation member 150a may be formed of a photo imageable encapsulant (PIE), Ajinomoto build-up film (ABF), or the like, but is not limited thereto.

In addition, the antenna package 100a may further include a plating member 160a disposed in the dielectric layer 140a to surround each of side surfaces of the plurality of feed vias 120a, 120b, 120c, and 120d. That is, the plating member 160a may form or define a plurality of cavities 130a, 130b, 130c, and 130d corresponding to each of the plurality of antenna members 115a, 115b, 115c, and 115d, and provide a boundary condition for transmission and reception of the RF signal of the corresponding antenna member.

In addition, the antenna package 100a may further include at least one second directional antenna member 170a disposed to be closer to side surfaces of the dielectric layer 140a than the plurality of antenna members 115a, 115b, 115c, and 115d in the dielectric layer 140a, and configured to be stood up at a corresponding position of at least one wiring layer 210a to extend in a direction toward the dielectric layer 140a and to transmit or receive a second RF signal.

That is, the antenna package 100a may transmit and receive the RF signal to and from the upper surface through the plurality of antenna members 115a, 115b, 115c, and 115d, and may transmit and receive the second RF signal to and from the side surfaces through at least one second directional antenna member 170a. Here, since at least one second directional antenna member 170a may transmit and receive the second RF signal in the state in which it is stood up, directivity for a side direction may be improved as compared to a second directional antenna member which is folded. Therefore, the antenna module may improve transmission and reception performance of the RF signal in the second direction and may omni-directionally expand a transmission and reception direction of the RF signal.

Figure 2:
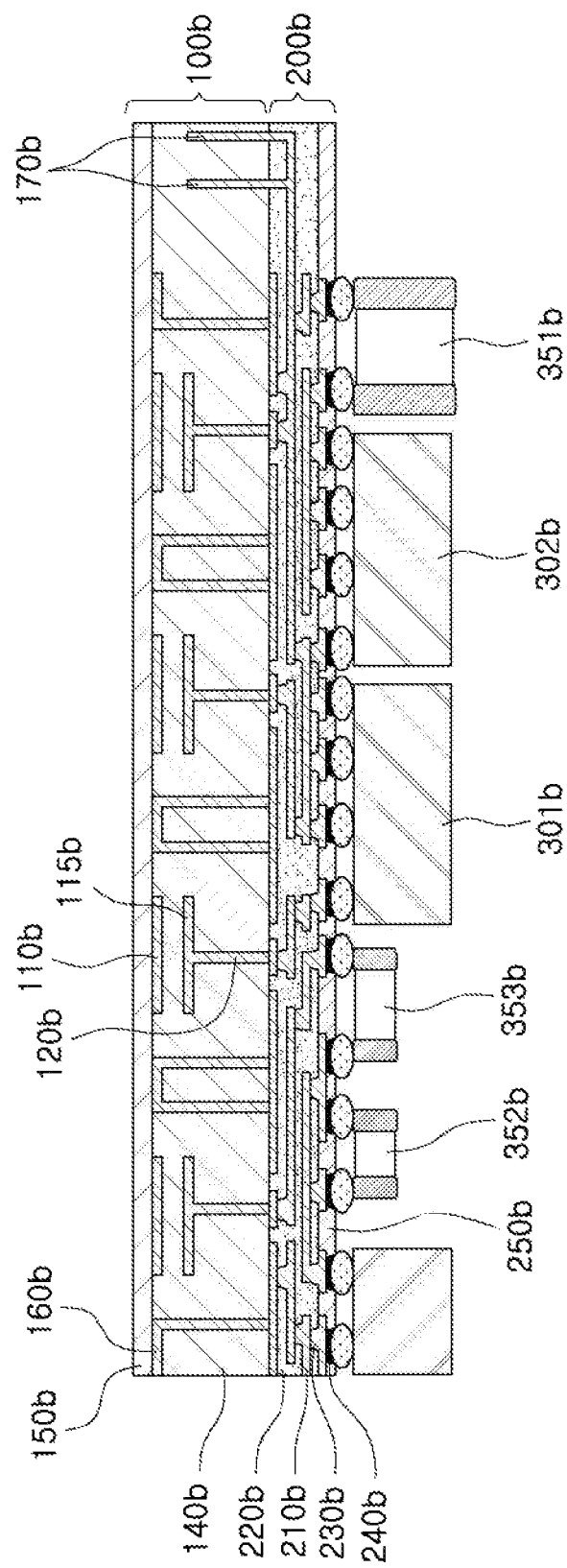
FIG. 2 is a view illustrating an example of an integrated circuit (IC) layout of an antenna module according to an exemplary embodiment.

FIG. 2 is a view illustrating an example of an integrated circuit (IC) layout of an antenna module according to an exemplary embodiment.

Referring to FIG. 2, an antenna module according to an exemplary embodiment may include an antenna package 100b, a connection member 200b, an IC 301b, a PMIC 302b, and a plurality of passive components 351b, 352b, and 353b.

The antenna package 100b may include one or more director member(s) 110b, antenna member(s) 115b, and feed via(s) 120b, a dielectric layer 140b, an encapsulation member 150b, one or more plating member(s) 160b, and a second directional antenna member 170b, and the connection member 200b may include at least one wiring layer 210b, at least one insulating layer 220b, a wiring via 230b, and a connection pad 240b.

The IC 301b may be disposed on a lower surface of the connection member 200b. The IC 301b may generate the RF signal transmitted to a plurality of antennal members 115b and receive the RF signal from the plurality of antenna members 115b.

In addition, the PMIC 302b may be further disposed on the lower surface of the connection member 200b. The PMIC 302b may generate power and may transmit the generated power to the IC 301b through at least one wiring layer 210b of the connection member 200b.

In addition, the plurality of passive components 351b, 352b, and 353b may be further disposed on the lower surface of the connection member 200b. The plurality of passive components 351b, 352b, and 353b may provide impedance to the IC 301b and/or the PMIC 302b. For example, the plurality of passive components 351b, 352b, and 353b may include at least a portion of a capacitor (e.g., a multilayer ceramic capacitor (MLCC)), an inductor, or a chip resistor.

Figure 3:
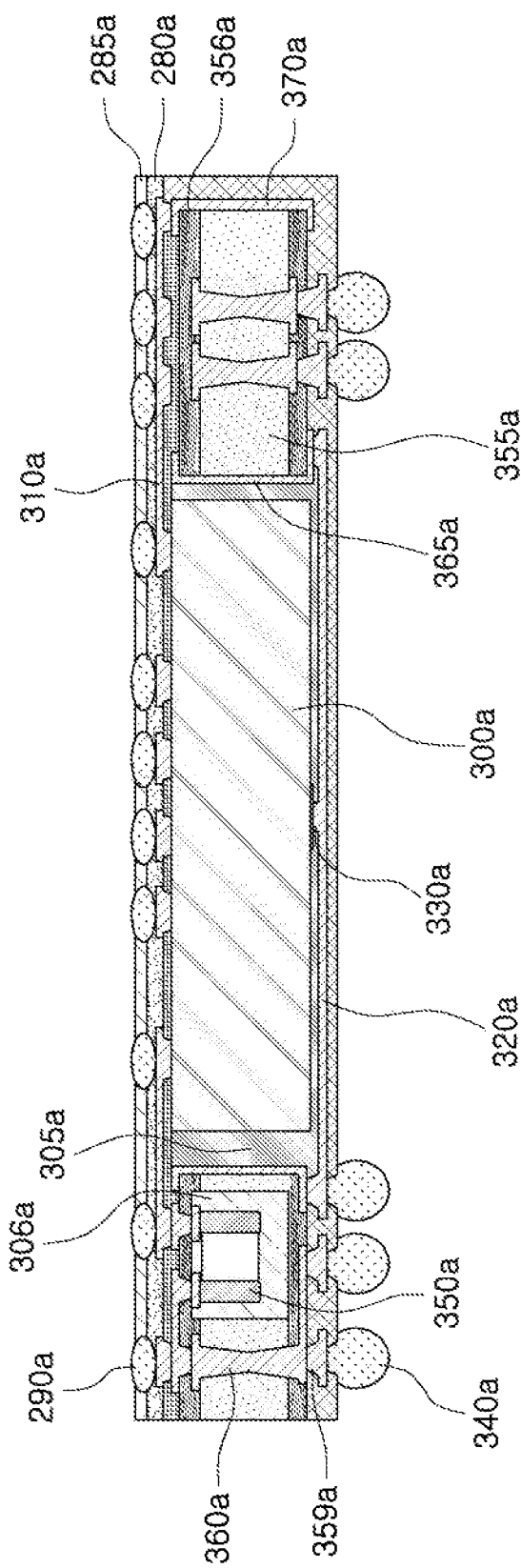
FIG. 3 is a view illustrating an example of an IC package of an antenna module according to an exemplary embodiment.

FIG. 3 is a view illustrating an example of an IC package of an antenna module according to an exemplary embodiment.

Referring to FIG. 3, the IC package may include an IC 300a, an encapsulant 305a encapsulating at least a portion of the IC 300a, a support member 355a disposed so that a first side surface thereof faces the IC 300a, at least one wiring layer 310a electrically connected to the IC 300a and the support member 355a, and an insulating layer 280a.

The IC package may be coupled to the connection member described above. A first RF signal generated from the IC 300a included in the IC package may be transmitted to the antenna package through at least one wiring layer 310a and may be transmitted in an upper surface direction of the antenna module, and the first RF signal received by the antenna package may be transmitted to the IC 300a through at least one wiring layer 310a.

The IC package may further include connection pads 330a disposed on an upper surface and/or a lower surface of the IC 300a. The connection pad disposed on the upper surface of the IC 300a may be electrically connected to at least one wiring layer 310a, and the connection pad disposed on the lower surface of the IC 300a may be electrically connected to a support member 355a or a core plating member 365a through a lower end wiring layer 320a. Here, the core plating member 365a may provide a ground region to the IC 300a.

The support member 355a may include a core dielectric layer 356a in contact with the connection member, core wiring layers 359a disposed on an upper surface and/or a lower surface of the core dielectric layer 356a, and at least one core via 360a penetrating through the core dielectric layer 356a, electrically connected to the core wiring layers 359a, and electrically connected to the connection pads 330a. At least one core via 360a may be electrically connected to an electrical connection structure 340a such as a solder ball, a pin, and a land.

Accordingly, the support member 355a may receive a base signal or power from a lower surface thereof and may transmit the base signal and/or power to the IC 300a through at least one wiring layer 310a.

The IC 300a may generate first and second RF signals of a millimeter wave (mmWave) band using the base signal and/or power. For example, the IC 300a may receive a base signal of a low frequency and may perform a frequency conversion, amplification, a filtering phase control, and a power generation of the base signal, and may be formed of a compound semiconductor (e.g., GaAs) or a silicon semiconductor in consideration of high frequency characteristics. Here, frequencies of the first and second RF signals may be the same as a first frequency (e.g., 28 GHz), and may be different from each other as a first or second frequency (e.g., 28 GHz, 36 GHz) depending on a design.

Meanwhile, the IC package may further include a passive component 350a electrically connected to a corresponding wire of at least one wiring layer 310a. The passive component 350a may be disposed in an accommodation space 306a provided by the support member 355a and may provide impedance to the IC 300a and/or at least one second directional antennal member 370a. For example, the passive component 350a may include at least a portion of a multilayer ceramic capacitor (MLCC), an inductor, or a chip resistor.

Meanwhile, the IC package may further include at least one second directional antenna member 370a configured to be stood up to extend in a direction (e.g., a downward direction) toward the IC package from a position in a second side surface of the support member 355a electrically connected to at least one wiring layer 310a and to transmit or receive the second RF signal. At least one second directional antenna member 370a may receive the second RF signal through at least one wiring layer 310a from the IC 300a, and may transmit the second RF signal to the IC 300a through at least one wiring layer 310a.

Meanwhile, the IC package may be coupled to the antenna package through the electrical connection structure 290a and the passivation layer 285a, but the electrical connection structure 290a and the passivation layer 285a may be omitted depending on a design.

Figure 4:
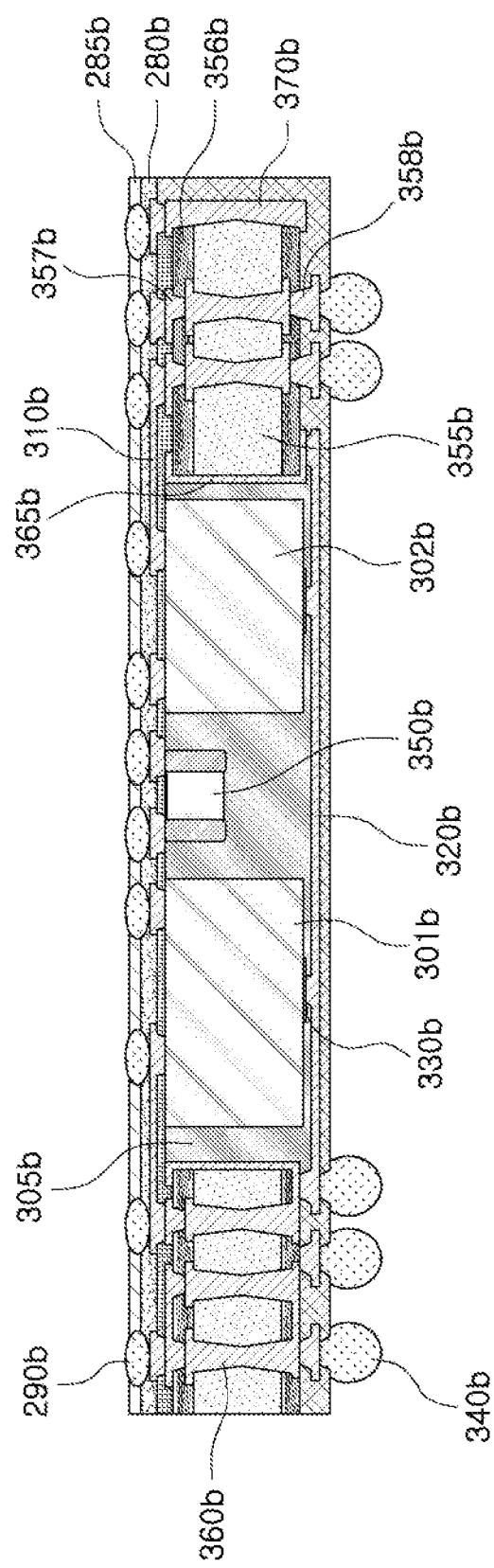
FIG. 4 is a view illustrating another example of an IC package of an antenna module according to an exemplary embodiment.

FIG. 4 is a view illustrating another example of an IC package of an antenna module according to an exemplary embodiment.

Referring to FIG. 4, the IC package may include an IC 301b, an encapsulant 305b encapsulating at least a portion of the IC 301b, a support member 355b having a first side surface disposed to face the IC 301b, at least one wiring layer 310b electrically connected to the IC 301b and the support member 355b, and an insulating layer 280b.

The IC package may further include a PMIC 302b disposed between the support member 355b and the IC 301b and supplying power to the IC 301b through a corresponding wire of at least one wiring layer 310b. The IC 301b may generate first and second RF signals of a millimeter wave (mmWave) band using the power supplied by the PMIC 302b.

The IC package may further include a passive component 350b that at least a portion thereof is encapsulated by the encapsulant 305b. That is, the IC 301b, the PMIC 302b, and the passive component 350b may be encapsulated together with each other by the encapsulant 305b. The encapsulant 305b may protect the IC 301b, the PMIC 302b, and the passive component 350b from external electrical/physical/chemical impact, and may be formed of a photo imageable encapsulant (PIE), Ajinomoto build-up film (ABF), epoxy molding compound (EMC), or the like, but is not limited thereto.

The support member 355b may include a core dielectric layer 356b in contact with the connection member, a first core wiring layer 357b in contact with the connection member and embedded in the core dielectric layer 356b, a second core wiring layer 358b opposing the first core wiring layer 357b of the core dielectric layer 356b, and at least one core via 360b penetrating through the core dielectric layer 356b, electrically connecting the first and second core wiring layers 357b and 358b to each other, and electrically connected to a connection pad 330b. At least one core via 360b may be electrically connected to the electrical connection structure 340b such as a solder ball.

Here, at least one second directional antenna member 370b disposed on a second side surface of the support member 355b may have a form in which a portion of at least one core via 360b and a portion of the core plating member 365b are bonded to each other. That is, at least one second directional antenna member 370b may be formed in a process of forming at least one core via 360b and/or the core plating member 365b.

Meanwhile, the IC package may be coupled to the antenna package through the electrical connection structure 290b and the passivation layer 285b, but the electrical connection structure 290b and the passivation layer 285b may be omitted depending on a design.

Figure 5:
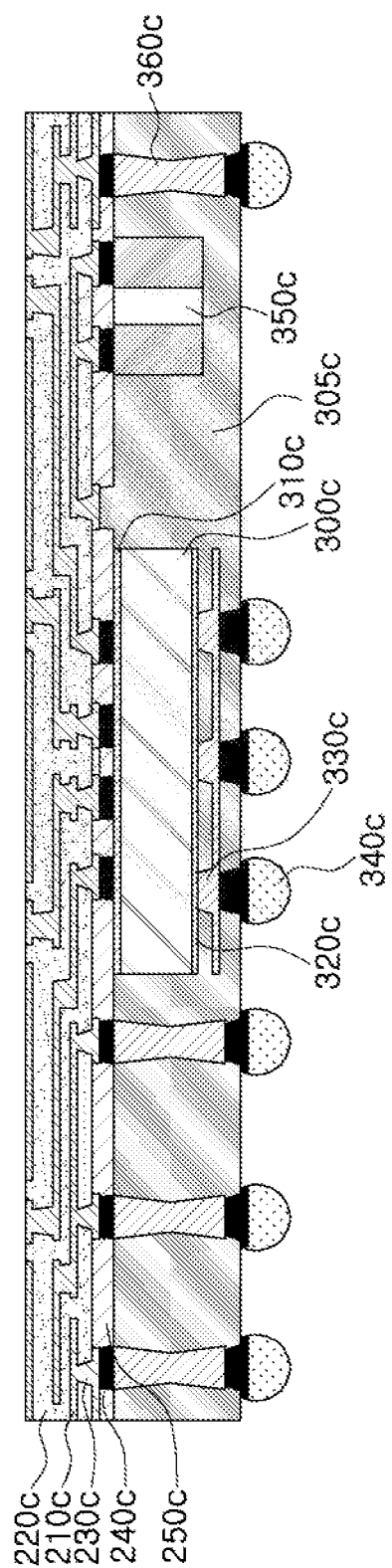
FIG. 5 is a view illustrating another example of an IC package of an antenna module according to an exemplary embodiment.

FIG. 5 is a view illustrating another example of an IC package of an antenna module according to an exemplary embodiment.

Referring to FIG. 5, the connection member may include at least one wiring layer 210c, at least one insulating layer 220c, a wiring via 230c, a connection pad 240c, and a passivation layer 250c, and the IC package may include an IC 300c, a lower end wiring layer 320c, an electrical connection structure 340c, a passive component 350c, and a core via 360c.

The IC 300c may include an active surface 310c, and may be electrically connected to the connection pad 240c through the active surface 310c. That is, since the IC 300c may be disposed to be face-up, an electrical distance up to an antenna member may be reduced and transmission loss of the RF signal may be reduced.

The lower end wiring layer 320c may be connected to a metal member 330c. The metal member 330c may radiate heat generated from the IC 300c or provide a ground to the IC 300c.

The encapsulant 305c may encapsulate at least portions of at least one core via 360c and the IC 300c.

The core via 360c may be disposed on a lower surface of the connection member to be electrically connected to a corresponding wire of at least one wiring layer 210c, and may be connected to the electrical connection structure 340c. That is, the core via 360c may be disposed independently even without support of the support member.

For example, the core via 360c may receive a base signal (e.g., power, a low frequency signal, or the like) from the electrical connection structure 340c and provide the base signal to the IC 300c. The IC 300c may generate an RF signal of a millimeter wave (mmWave) band by performing a frequency conversion, amplification, and a filtering phase control using the base signal and transmit the RF signal to the antenna package. For example, a frequency of the RF signal may be 28 GHz and/or 36 GHz, but is not limited thereto and may be varied according to a communications scheme of the antenna module.

Figure 6:
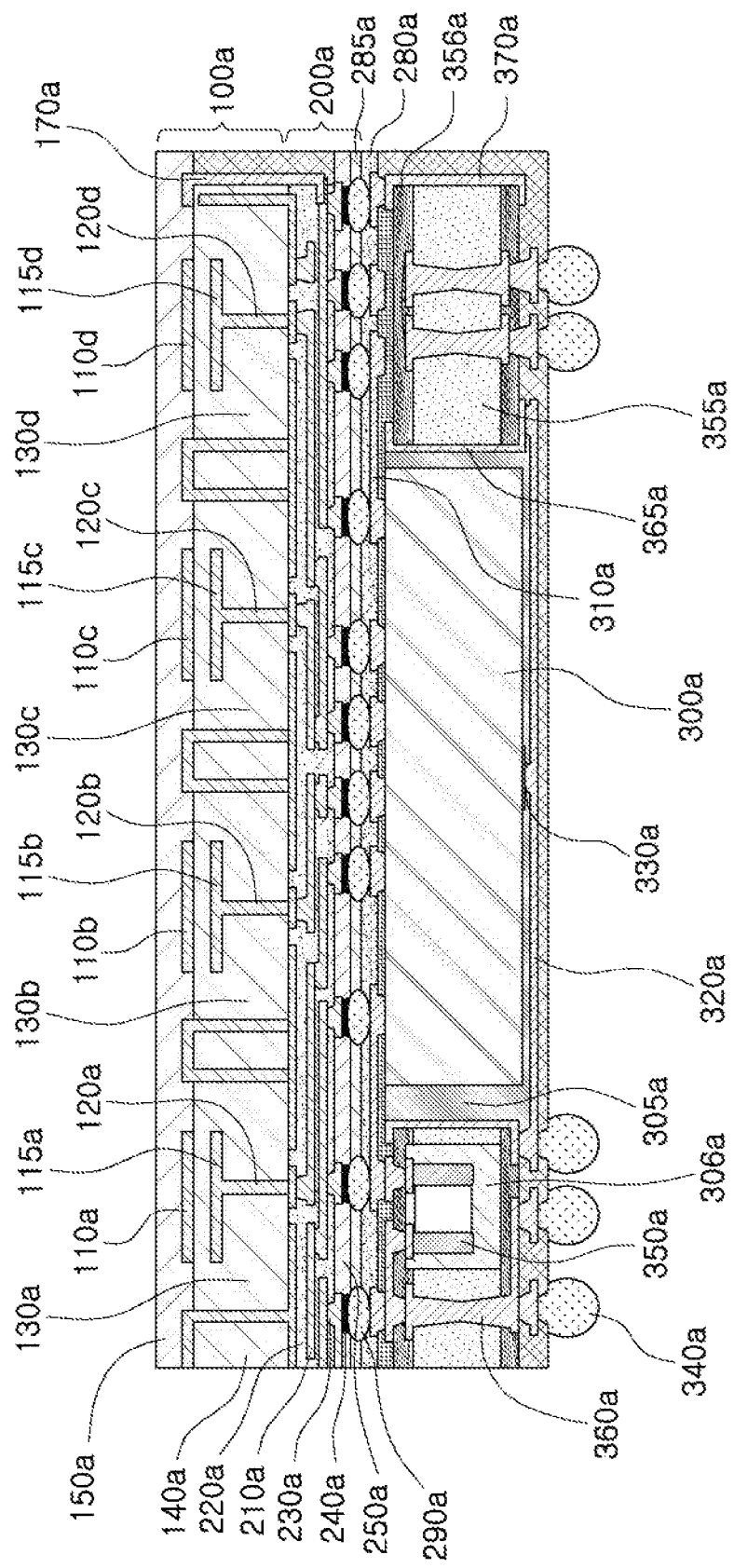
FIG. 6 is a view illustrating an example of an antenna module in which an IC package and a connection member are coupled to each other according to an exemplary embodiment.

FIG. 6 is a view illustrating an example of an antenna module in which an IC package and a connection member are coupled to each other according to an exemplary embodiment.

Referring to FIG. 6, the connection member 200a and the IC package may be coupled to each other through the electrical connection structure 290a. The IC package and the antenna package may be manufactured and coupled independently of each other, but may also be manufactured together depending on a design. That is, a separate coupling process between a plurality of packages may be omitted.

Meanwhile, the dielectric layer 140a may have a dielectric constant greater than that of the encapsulation member 150a and/or the encapsulant 305a, and at least one insulating layer 220a may have a dielectric constant smaller than that of the encapsulation member 150a and/or the encapsulant 305a. Accordingly, the antenna package 100a may be advantageous in terms of miniaturizing by reducing the size of the dielectric layer 140a needed in terms of securing the antenna performance, and the connection member 200a may reduce transmission loss of the RF signal by having a relatively small dielectric constant.

FIGS. 7A through 7F are views illustrating an example of a manufacturing method of an antenna module according to an exemplary embodiment.

Referring to FIG. 7A, a dielectric layer 140h may be provided in a state in which some regions thereof are removed, and a feed via 120h and a plating member 160h may be filled in some regions.

Referring to FIG. 7B, an antenna member 115h and a plating member 160i may be disposed on an upper surface of the dielectric layer 140h, and a film 180h may be disposed on a lower surface of the dielectric layer 140h.

Referring to FIG. 7C, a second dielectric layer 140i having the same dielectric constant as that of the dielectric layer 140h may be disposed on the upper surface of the dielectric layer 140h, and a director member 110h may be disposed on an upper surface of the second dielectric layer

140i. The second dielectric layer 140i may be integrated with the dielectric layer 140h to form a single dielectric layer.

Referring to FIG. 7D, the encapsulation member 150h before being cured may be disposed on the upper surface of the second dielectric layer 140i, and may be cured after being disposed on the upper surface of the second dielectric layer 140i.

Figure 7E:
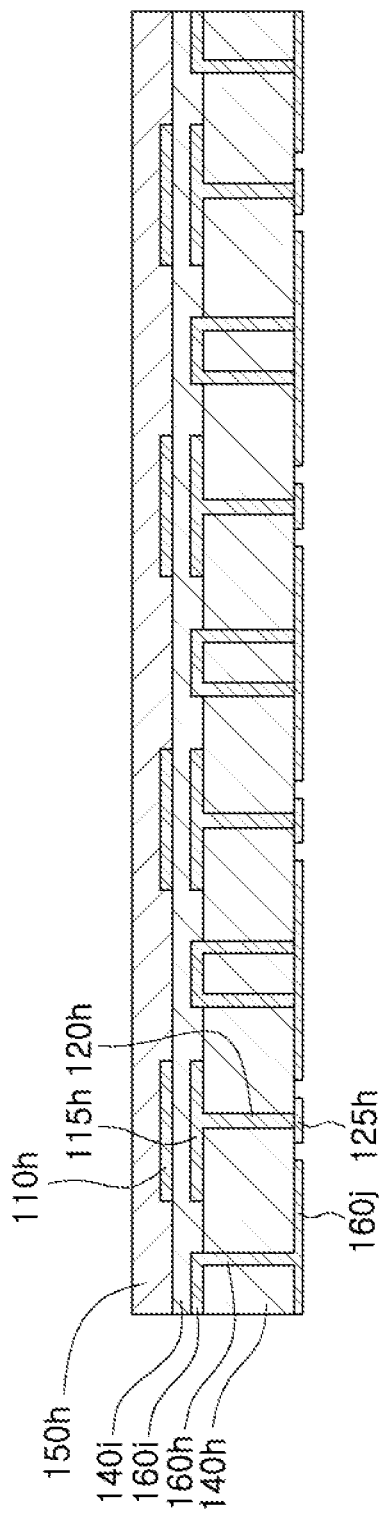

Referring to FIG. 7E, the film 180h may be removed after the encapsulation member 150h is cured, and an electrical connection structure 125h and a plating member 160j may be disposed on the lower surface of the dielectric layer 140h.

Figure 7F:
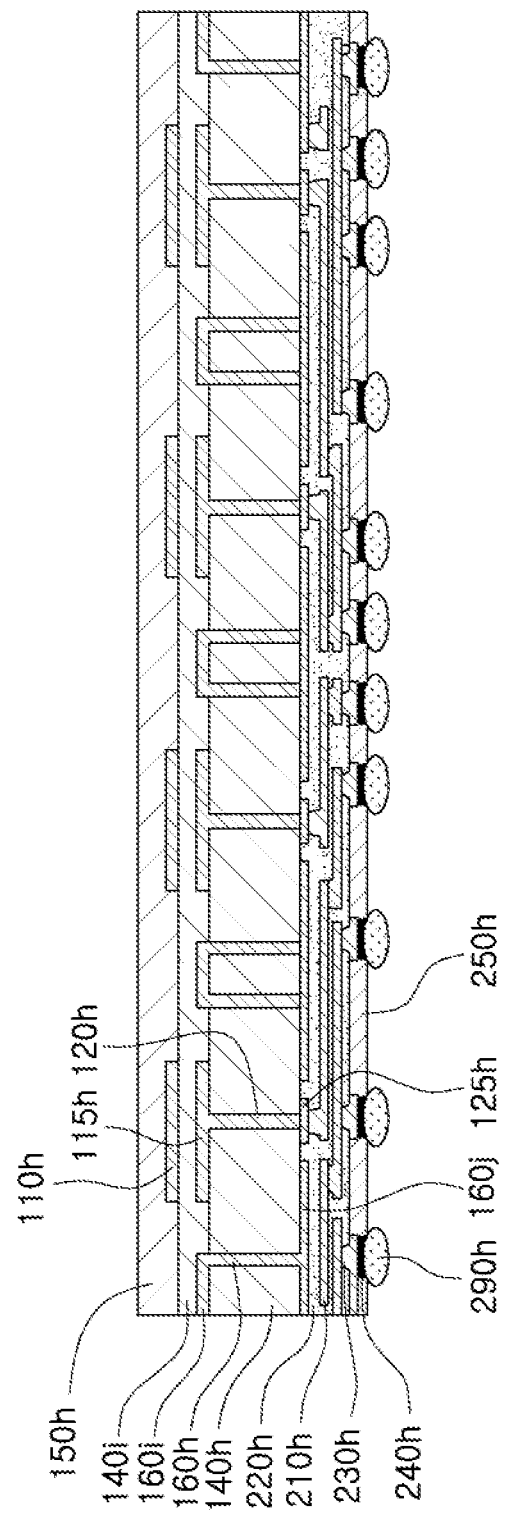

Referring to FIG. 7F, the connection member including at least one wiring layer 210h, at least one insulating layer 220h, a wiring via 230h, a connection pad 240h, a passivation layer 250h, and an electrical connection structure 290h may be disposed below the electrical connection structure 125h and the plating member 160j. The connection member may be coupled to the IC package through the electrical connection structure 290h.

Meanwhile, the director member 110h, the antenna member 115h, the feed via 120h, the electrical connection structure 125h, and the plating member 160h may be formed according to a negative or positive printing method, and may include a metal material (e.g., a conductive material such as copper (Cu), aluminum (Al), silver (Ag), tin (Sn), gold (Au), nickel (Ni), lead (Pb), titanium (Ti), or an alloy thereof).

Meanwhile, the director member 110h, the antenna member 115h, the through-via 120h, the electrical connection structure 125h, and the plating member 160h may be formed by a plating method such as chemical vapor deposition (CVD), physical vapor deposition (PVD), sputtering, subtractive, additive, semi-additive process (SAP), modified semi-additive process (MSAP), or the like, but is not limited thereto.

Figure 8:
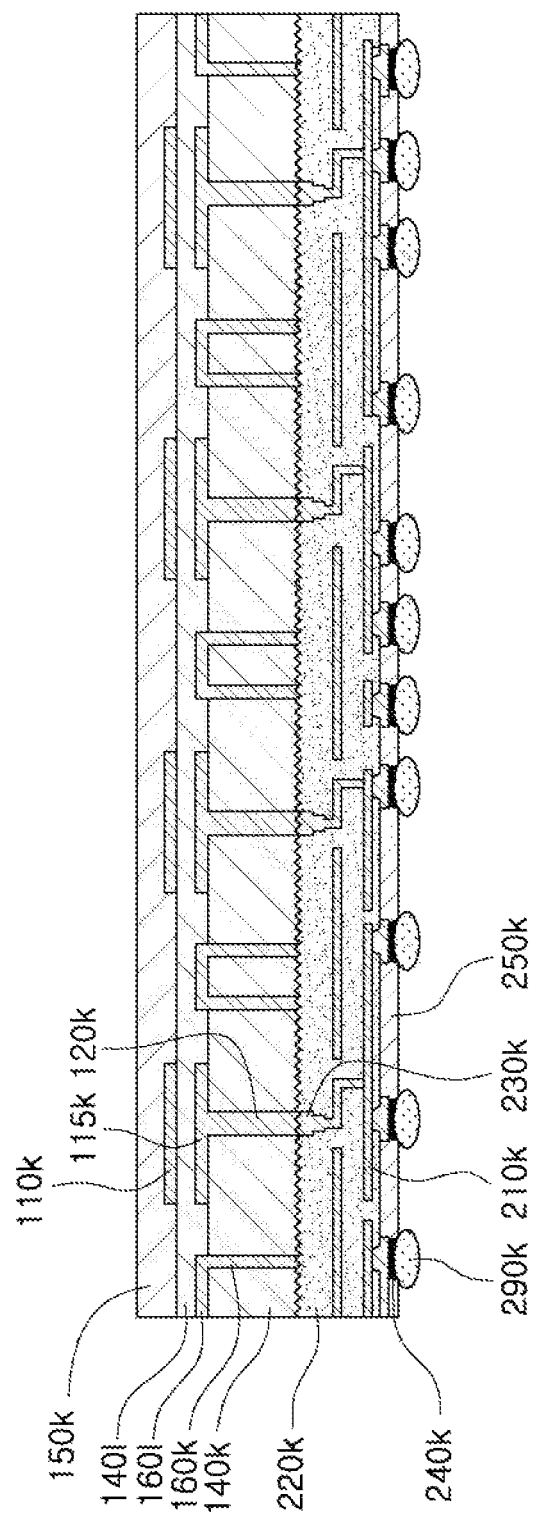
FIG. 8 is a view illustrating another example of a connection member of an antenna module according to an exemplary embodiment.

FIG. 8 is a view illustrating another example of a connection member of an antenna module according to an exemplary embodiment.

Referring to FIG. 8, an antenna module according to an exemplary embodiment may include an antenna package including a director member 110k, an antenna member 115k, a feed via 120k, dielectric layers 140k and 140l, an encapsulation member 150k, and plating members 160k and 160l, and a connection member including at least one wiring layer 210k, at least one insulating layer 220k, a wiring via 230k, a connection pad 240k, a passivation layer 250k, and an electrical connection structure 290k.

An upper surface of the connection member may have roughness rougher than that of a lower surface of the connection member. Accordingly, bonding stability between the dielectric layers 140k and 140l having a large dielectric constant and at least one insulating layer 220k having a small dielectric constant may be improved.

In addition, the connection member may have a thicker wiring (e.g., a wiring layer, a wiring via) as being closer to the feed via 120k. Accordingly, electrical connection stability between the feed via 120k surrounded by the dielectric layers 140k and 140l having the large dielectric constant and the wiring via 230k surrounded by at least one insulating layer 220k having the small dielectric constant may be improved.

FIGS. 9A through 9G are views illustrating an example of a manufacturing method of an IC package of an antenna module according to an exemplary embodiment.

Referring to FIG. 9A, the support member 355h having the core via 360h inserted thereinto and an accommodation space of the passive component 350h may be compressed to the film 380h. The core via 360h may be formed of a conductive material such as copper (Cu), aluminum (Al), silver (Ag), tin (Sn), gold (Au), nickel (Ni), lead (Pb), titanium (Ti), or alloys thereof.

Referring to FIG. 9B, a core dielectric layer 356h may be disposed on each of the opposite surfaces of the support member 355h, and a core wiring layer 359h may be connected to each of the opposite ends of the core via 360h.

Referring to FIG. 9C, portions of the support member 355h and the core dielectric layer 356h may be etched, and a core plating member 365h and a second directional antenna member 370h may be formed on the etched surfaces of the support member 355h and the core dielectric layer 356h by a plating method. The film 380h may be then removed.

Referring to FIG. 9D, an IC 300h may be disposed in the etched portions of the support member 355h and the core dielectric layer 356h, and an encapsulant 305h may encapsulate at least a portion of the IC 300h. The IC package in a fourth operation may be rotated in a process of performing a fifth operation.

Referring to FIG. 9E, an insulating layer 280h may be disposed on the IC 300h and the support member 355h.

Referring to FIG. 9F, at least one wiring layer 310h may be disposed on the support member 355h to electrically connect the second directional antenna member 370h and/or the core via 360h to the IC 300h, and may be formed of a conductive material such as copper (Cu), aluminum (Al), silver (Ag), tin (Sn), gold (Au), nickel (Ni), lead (Pb), titanium (Ti), or an alloy thereof.

Figure 9G:
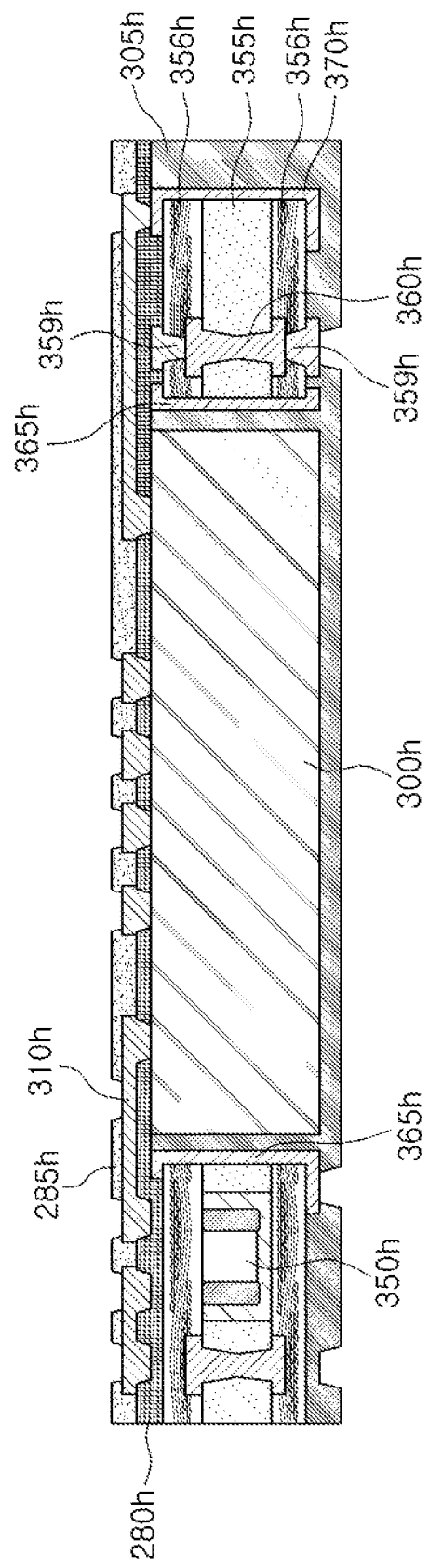

Referring to FIG. 9G, a passivation layer 285h may have a layout space of the connection pad or the electrical connection structure and may be disposed on at least one wiring layer 310h.

Figure 10:
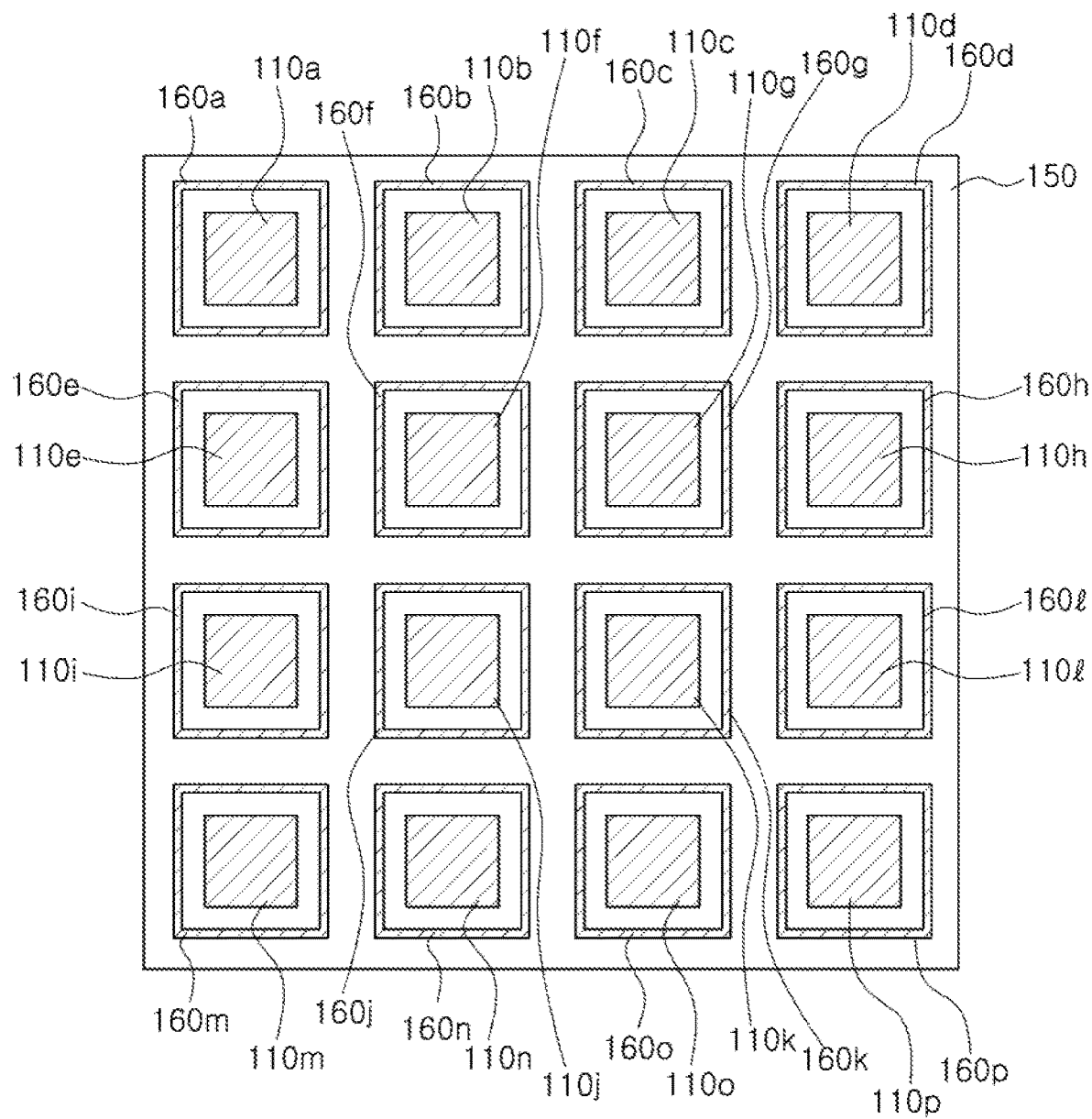
FIG. 10 is a schematic view illustrating an upper surface of an example of an antenna module according to an exemplary embodiment.

FIG. 10 is a schematic view illustrating an upper surface of an example of an antenna module according to an exemplary embodiment.

Referring to FIG. 10, each of a plurality of director members 110a, 110b, 110c, 110d, 110e, 110f, 110g, 110h, 110i, 110j, 110k, 110l, 110m, 110n, 110o, and 110p may have a form of a patch antenna and may be surrounded by a corresponding plating member of a plurality of plating members 160a, 160b, 160c, 160d, 160e, 160f, 160g, 160h, 160i, 160j, 160k, 160l, 160m, 160n, 160o, and 160p. If the antenna module does not include the director members, the plurality of director members 110a, 110b, 110c, 110d, 110e, 110f, 110g, 110h, 110i, 110j, 110k, 110l, 110m, 110n, 110o, and 110p may be replaced with a plurality of antenna members.

Figure 11:
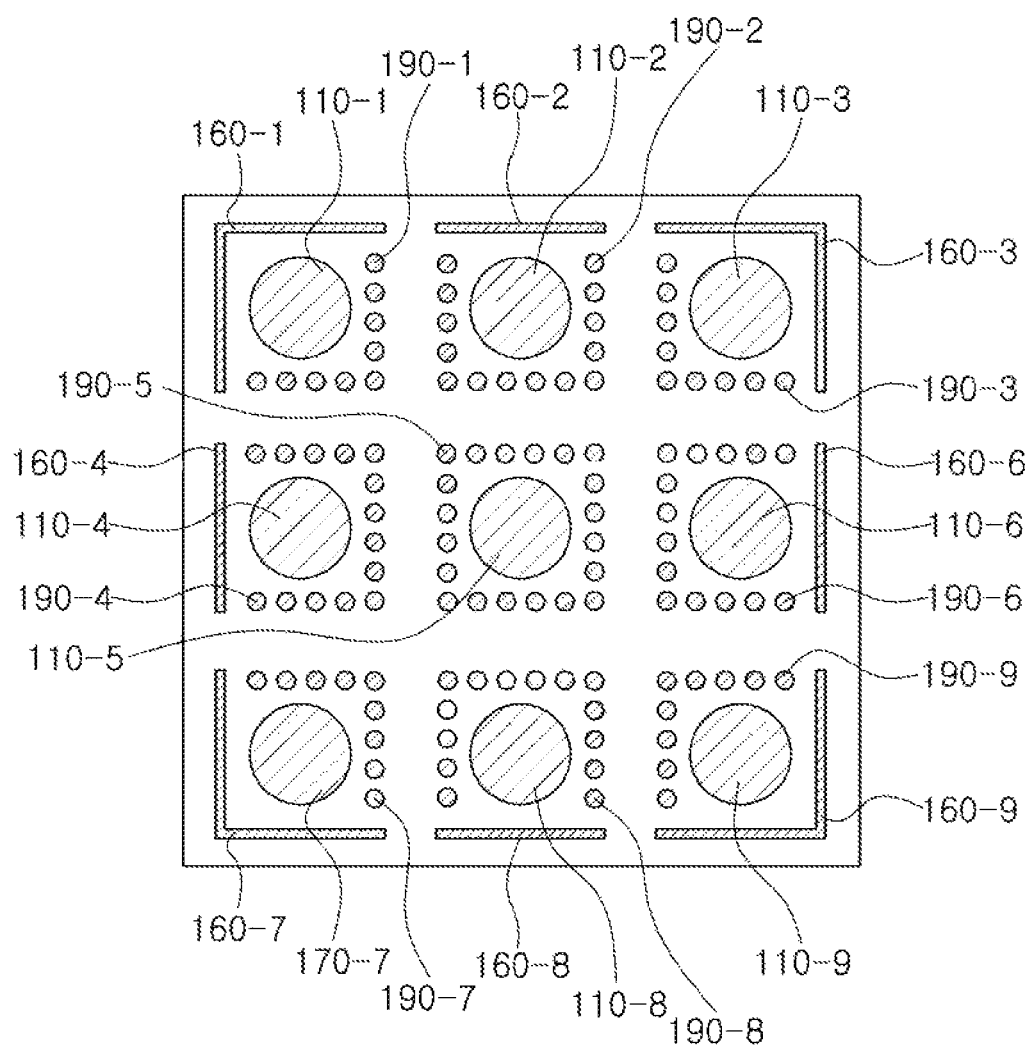
FIG. 11 is a schematic view illustrating an upper surface of another example of an antenna module according to an exemplary embodiment.

FIG. 11 is a schematic view illustrating an upper surface of another example of an antenna module according to an exemplary embodiment.

Referring to FIG. 11, each of a plurality of director members 110-1, 110-2, 110-3, 110-4, 110-5, 110-6, 110-7, 110-8, and 110-9 may be surrounded by at least one of corresponding plating members 160-1, 160-2, 160-3, 160-4, 160-6, 160-7, 160-8, and 160-9, and/or a plurality of shielding vias 190-1, 190-2, 190-3, 190-4, 190-5, 190-6, 190-7, 190-8, and 190-9. If the antenna module does not include the director members, the plurality of director members 110-1, 110-2, 110-3, 110-4, 110-5, 110-6, 110-7, 110-8, and 110-9 may be replaced with a plurality of antenna members.

That is, a portion of a side surface of a cavity of the antenna package of the antenna module may be surrounded by the plurality of shielding vias instead of the plating member.

Meanwhile, the number, layout, and shape of the plurality of director members or the plurality of antenna members illustrated in FIGS. 10 and 11 are not particularly limited. For example, the shape of the plurality of director members illustrated in FIG. 10 may be circular shape, and the number of the plurality of director members illustrated in FIG. 11 may be four.

Figure 12A:
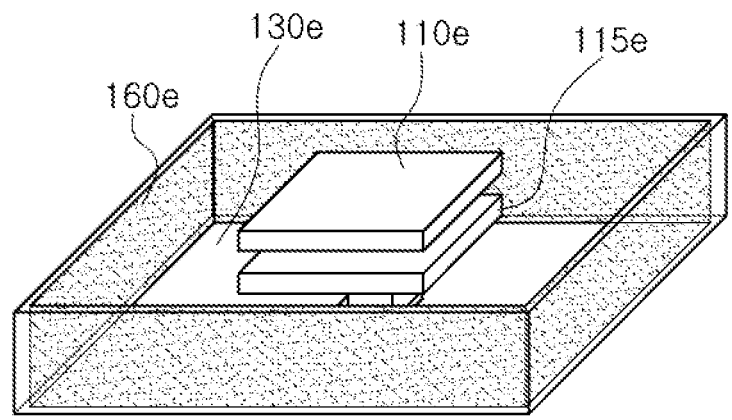
FIGS. 12A through 12C are perspective views each illustrating an example of a cavity of an antenna package according to an exemplary embodiment.
Figure 12B:
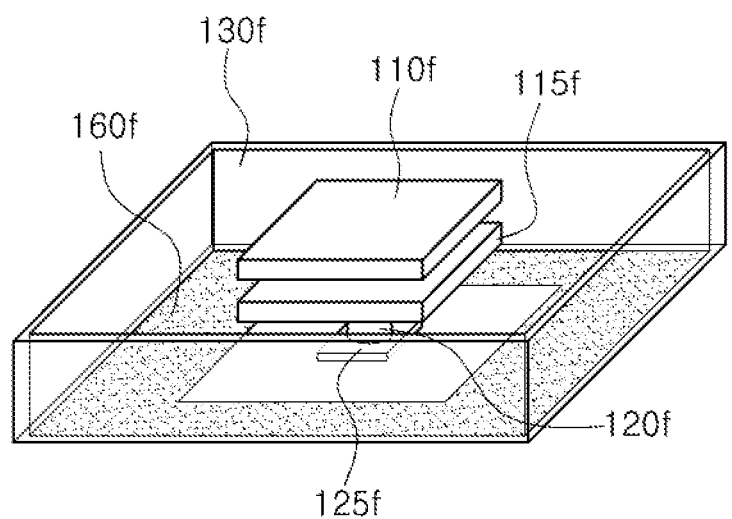
Figure 12C:
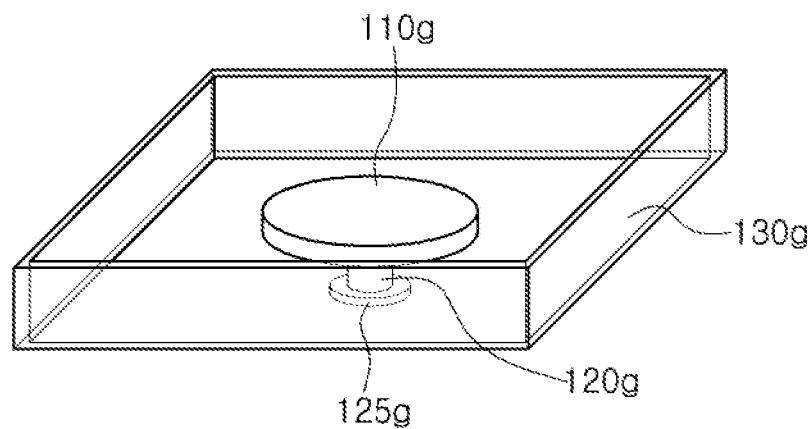

FIGS. 12A through 12C are perspective views each illustrating an example of a cavity of an antenna package according to an exemplary embodiment.

Referring to FIG. 12A, a cavity may include at least portions of a director member 110e, an antenna member 115e, a feed via, an electrical connection structure, a dielectric layer 130e, and a plating member 160e. Here, the plating member 160e may be disposed to surround side surfaces of the cavity. That is, a lower surface of the cavity may be covered by a ground pattern disposed on an upper surface of the connection member.

Referring to FIG. 12B, the cavity may include at least portions of a director member 110f, an antenna member 115f, a feed via 120f, an electrical connection structure 125f, a dielectric layer 130f, and a plating member 160f. Here, the plating member 160f may be disposed to cover a portion of the lower surface of the cavity. That is, the side surfaces of the cavity may be surrounded by the plating member disposed on side surfaces of an insulating member on the connection member. Accordingly, isolation between the connection member and the IC of the antenna package may be improved.

Referring to FIG. 12C, the cavity may include at least portions of an antenna member 110g, a feed via 120g, an electrical connection structure 125g, and a dielectric layer 130g. That is, the side surfaces of the cavity may be surrounded by the plating member disposed on the side surfaces of the insulating member on the connection member, and the lower surface of the cavity may be covered by the ground pattern disposed on the upper surface of the connection member.

Meanwhile, the electrical connection structures 125f and 125g may be connected to a corresponding wire of at least one wiring layer 210 of the connection member when the antenna package and the connection member are coupled to each other. For example, the electrical connection structures 125f and 125g may be implemented as electrodes, pins, solder balls, lands, and the like.

Figure 13:
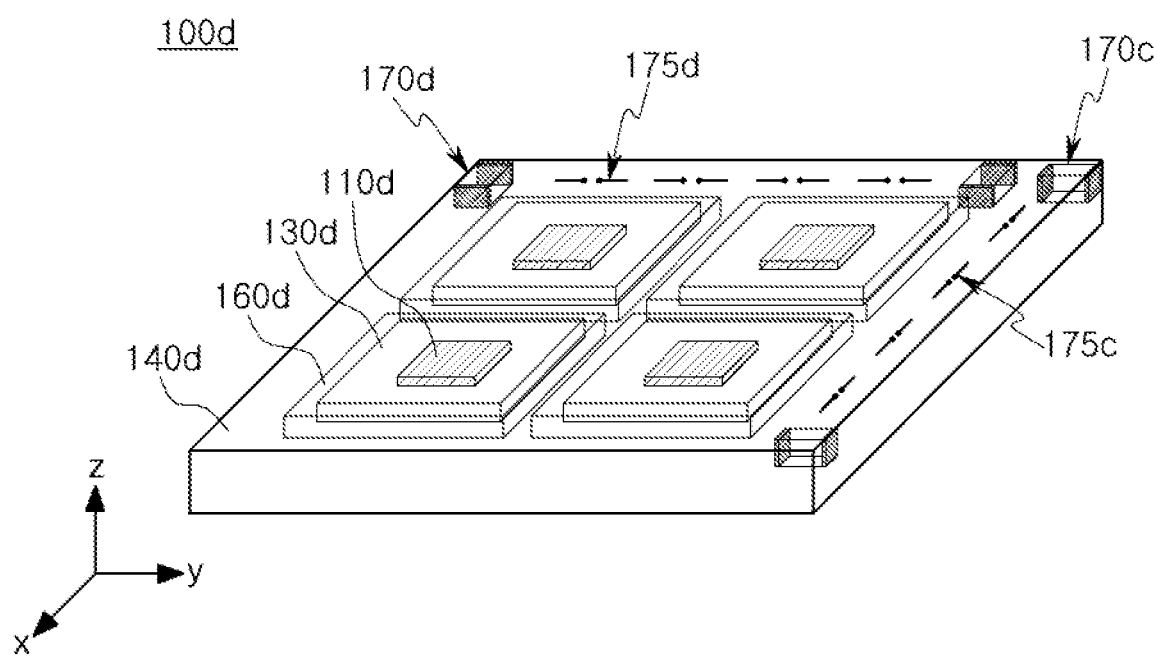
FIG. 13 is a perspective view illustrating an example of an antenna package according to an exemplary embodiment.

FIG. 13 is a perspective view illustrating an example of an antenna package according to an exemplary embodiment.

Referring to FIG. 13, an antenna package may include a plurality of director members 110d, a cavity 130d, a dielectric layer 140d, a plating member 160d, a plurality of directional antennal members 170c and 170d, and a plurality of dipole antennas 175c and 175d.

A plurality of director members 110d may transmit and receive an RF signal in a z axis direction, together with corresponding antenna members.

A plurality of second directional antenna members 170c and 170d may be disposed to be adjacent to an edge of the antenna package and to be stood up in the z axis direction, and one of the plurality of directional antennas 170c and 170d may transmit and receive a second RF signal in an x axis direction and the other thereof may transmit and receive the second RF signal in a y axis direction.

A plurality of dipole antennas 175c and 175d may be disposed between the dielectric layer 140d and an encapsulation member to be adjacent to the edge of the antenna package, and one of the plurality of dipole antennas 175c and 175d may transmit and receive a third RF signal in the x axis direction and the other thereof may transmit and receive the third RF signal in the y axis direction. Depending on a design, at least a portion of the plurality of dipole antennas 175c and 175d may be replaced with a monopole antenna.

Meanwhile, the IC package disclosed herein may be implemented according to a fan-out semiconductor package to be described below. To facilitate understanding of the fan-out semiconductor package, a description will be made with reference to FIGS. 14 through 21.

Figure 14:
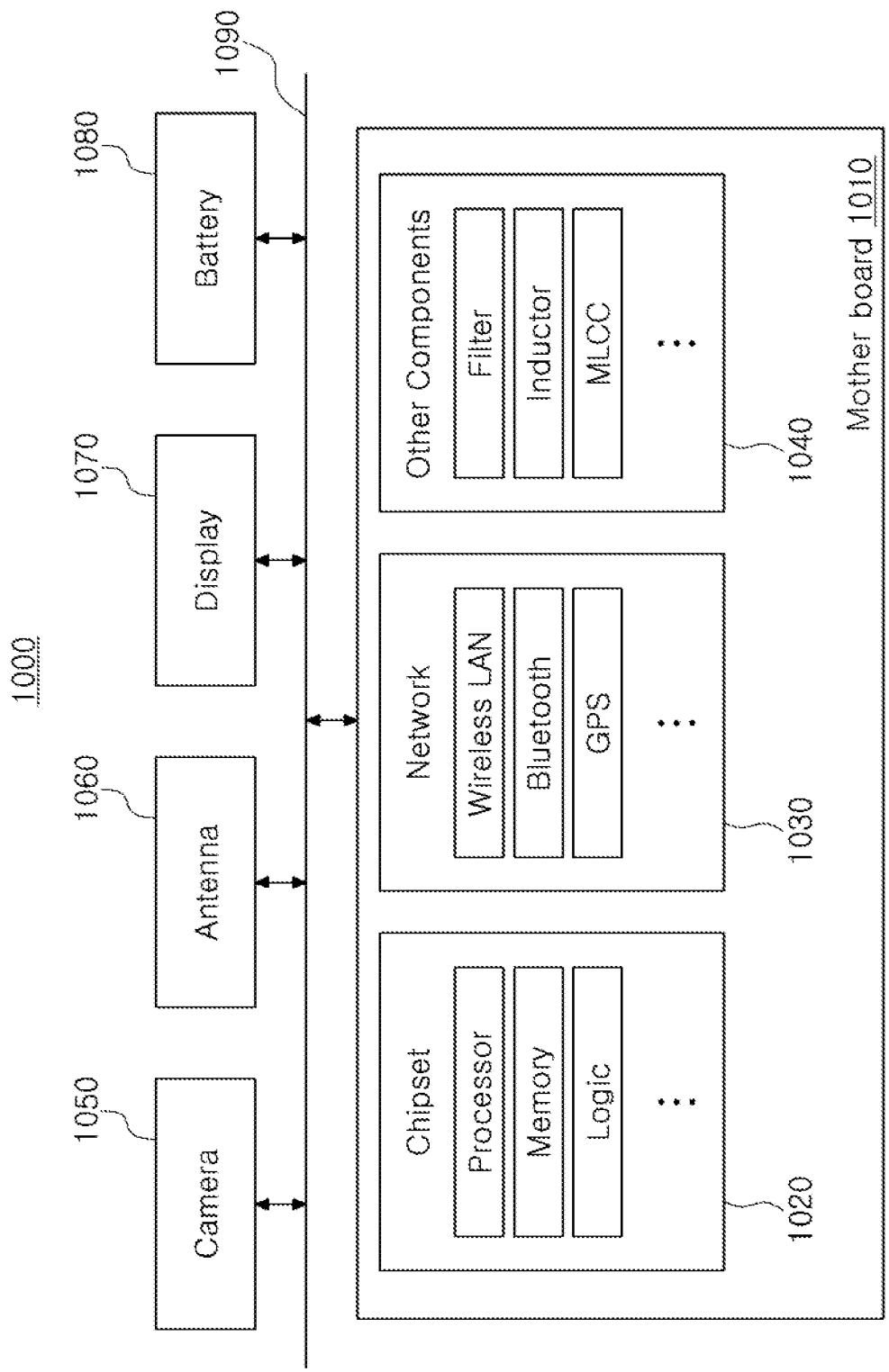
FIG. 14 is a schematic block diagram illustrating an example of an electronic device system.

FIG. 14 is a schematic block diagram illustrating an example of an electronic device system.

Referring to FIG. 14, an electronic device 1000 may accommodate a mainboard 1010 therein. The mainboard 1010 or motherboard may include chip related components 1020, network related components 1030, other components 1040, and the like, physically or electrically connected thereto. These components may be connected to others to be described below across various signal lines 1090.

The chip related components 1020 or chipset may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include components for supporting communications using various protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include components supporting a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 15:
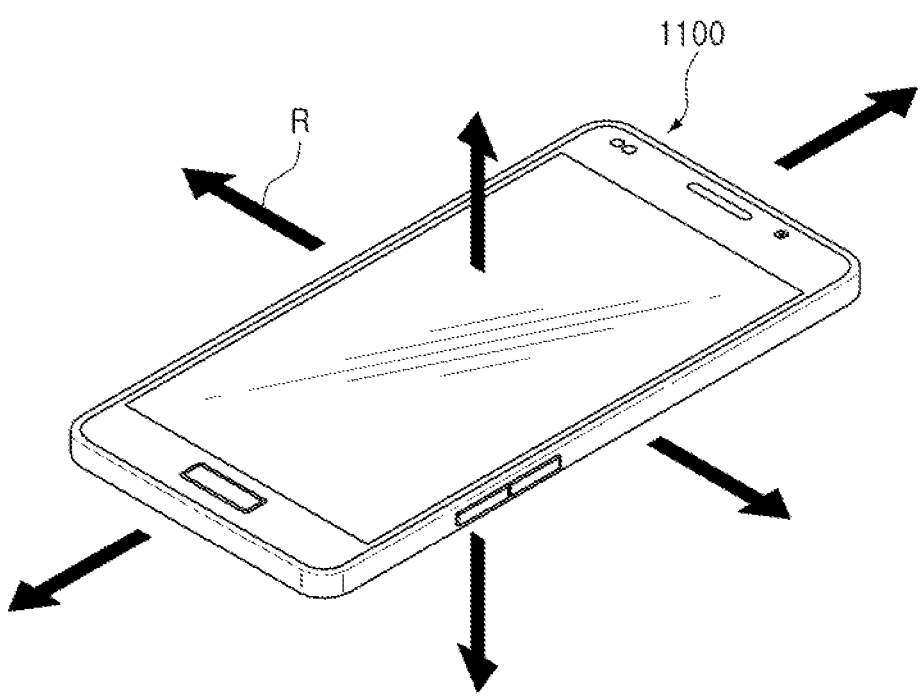
FIG. 15 is a schematic perspective view illustrating an example of an electronic device.

FIG. 15 is a schematic perspective view illustrating an example of an electronic device.

Referring to FIG. 15, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used by itself, but may be packaged and used in an electronic device, or the like, in a packaged state.

Additionally, semiconductor packaging can be used due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are commonly significantly larger than those of the semiconductor chip. Therefore, it may be difficult to directly mount the semiconductor chip on the mainboard, and packaging technology for buffering a difference in a circuit width between the semiconductor chip and the mainboard is advantageously used.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

FIGS. 16A and 16B are schematic cross-sectional views illustrating a fan-in semiconductor package before and after being packaged.

Figure 17:
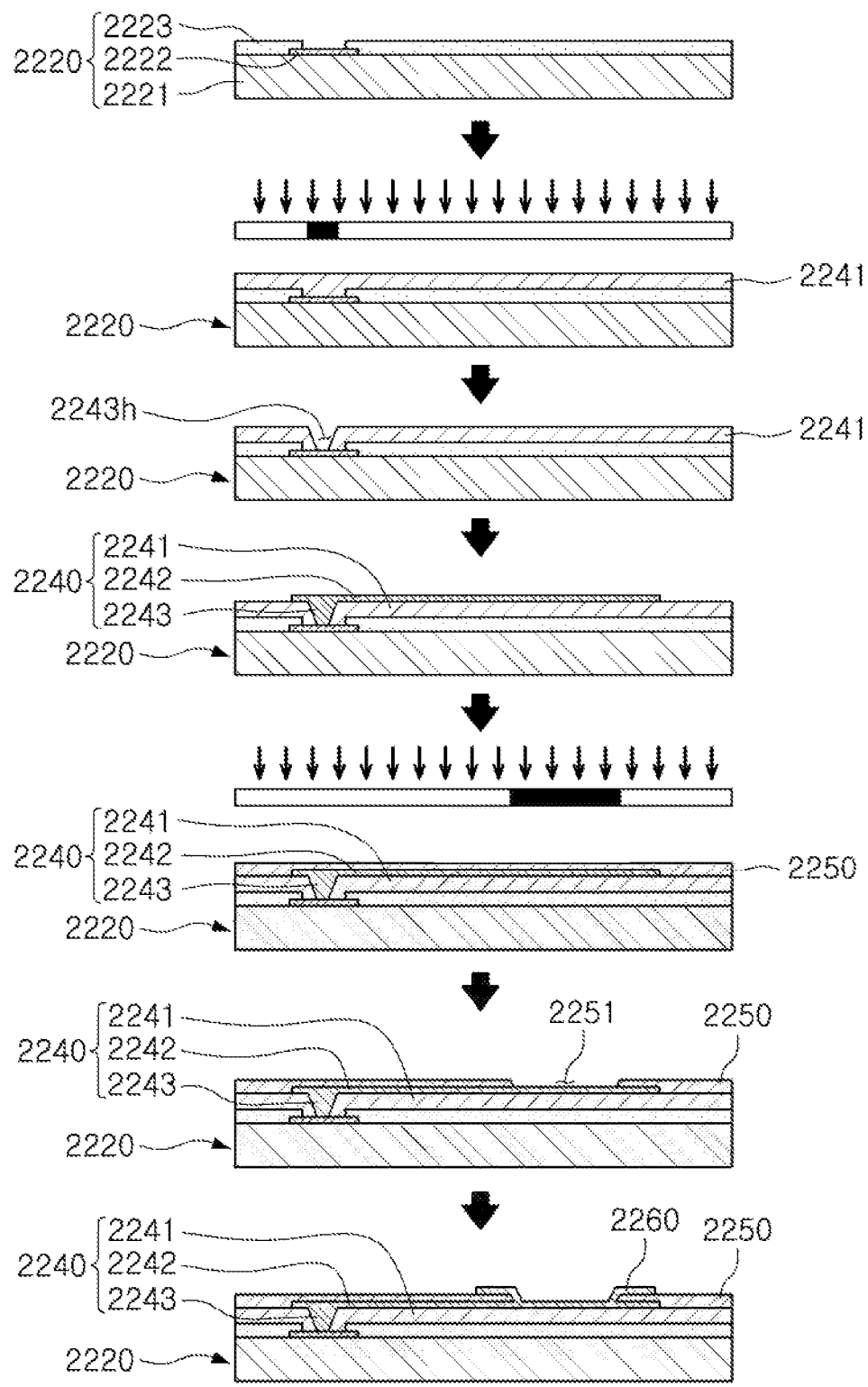
FIG. 17 is schematic cross-sectional views illustrating a packaging process of a fan-in semiconductor package.

FIG. 17 is schematic cross-sectional views illustrating a packaging process of a fan-in semiconductor package.

Referring to FIGS. 16A, 16B, and 17, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimageable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip, are disposed inside a footprint or area of overlap with the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals are disposed inside the footprint or area of overlap with the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 18:
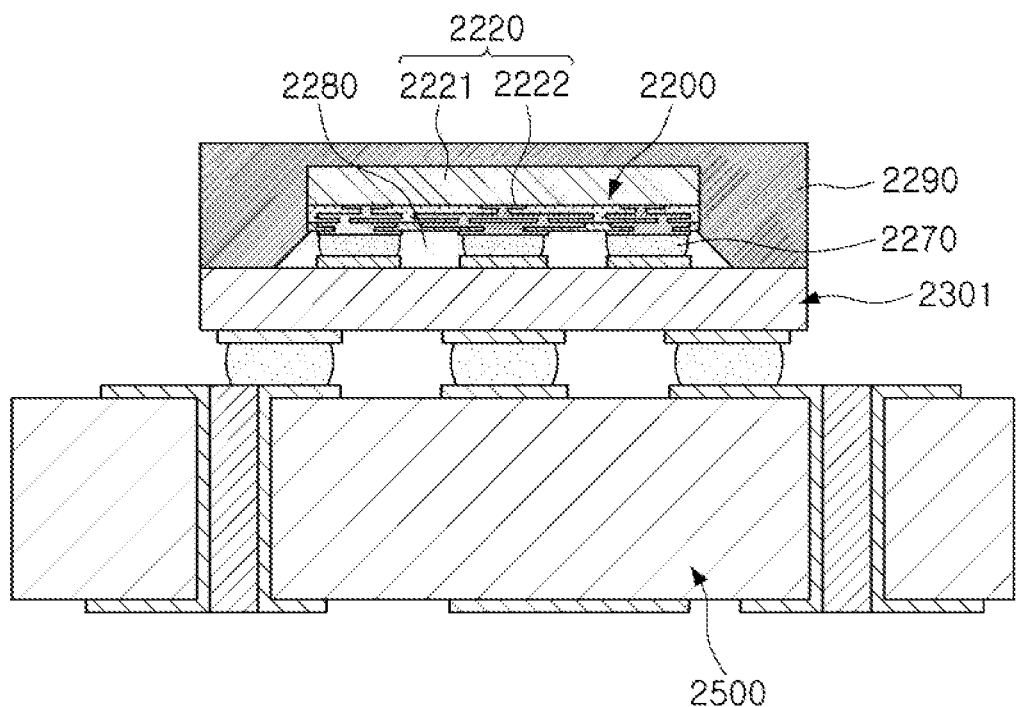
FIG. 18 is a schematic cross-sectional view illustrating a fan-in semiconductor package mounted on an interposer substrate and ultimately mounted on a main board of an electronic device.

FIG. 18 is a schematic cross-sectional view illustrating a fan-in semiconductor package mounted on an interposer substrate and ultimately mounted on a mainboard of an electronic device.

Figure 19:
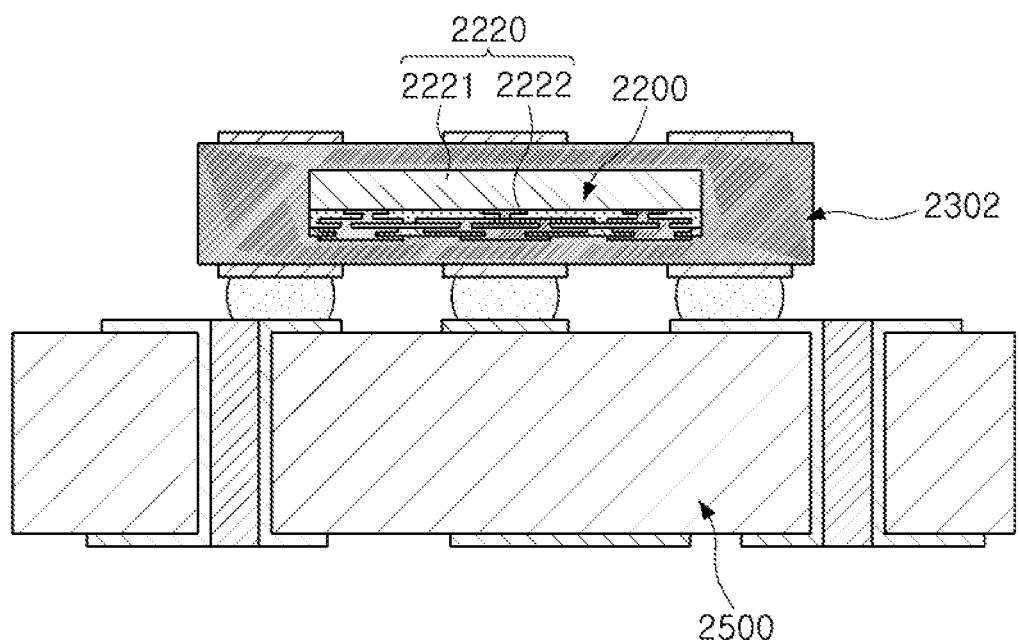
FIG. 19 is a schematic cross-sectional view illustrating a fan-in semiconductor package embedded in an interposer substrate and ultimately mounted on a main board of an electronic device.

FIG. 19 is a schematic cross-sectional view illustrating a fan-in semiconductor package embedded in an interposer substrate and ultimately mounted on a mainboard of an electronic device.

Referring to FIGS. 18 and 19, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Figure 20:
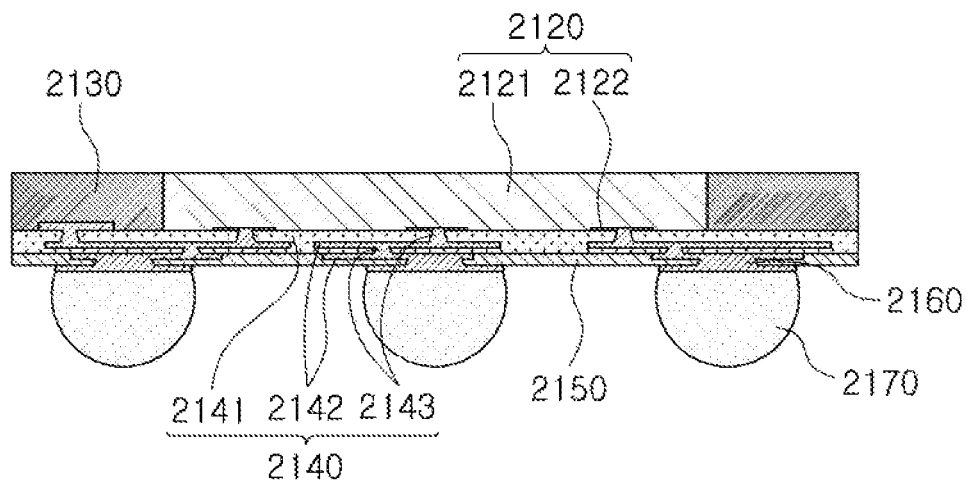
FIG. 20 is a schematic cross-sectional view illustrating a fan-out semiconductor package.

FIG. 20 is a schematic cross-sectional view illustrating a fan-out semiconductor package.

Referring to FIG. 20, in a fan-out semiconductor package 2100, for example, an outer side of a semiconductor chip 2120 may be protected by an encapsulant 2130, and connection pads 2122 of the semiconductor chip 2120 may be redistributed outwardly of the footprint or area of overlap with the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the footprint or area of overlap with the semiconductor chip through the connection member formed on the semiconductor chip. As described above, in the fan-in semiconductor package, all I/O terminals of the semiconductor chip need to be disposed inside the footprint of the semiconductor chip. Therefore, when a size of the semiconductor chip is decreased, a size and a pitch of balls need to be decreased, such that a standardized ball layout may not readily be used in the fan-in semiconductor package. On the other hand, the fan-out semiconductor package has the form in which the I/O terminals of the semiconductor chip are redistributed and disposed outwardly from the footprint of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 21:
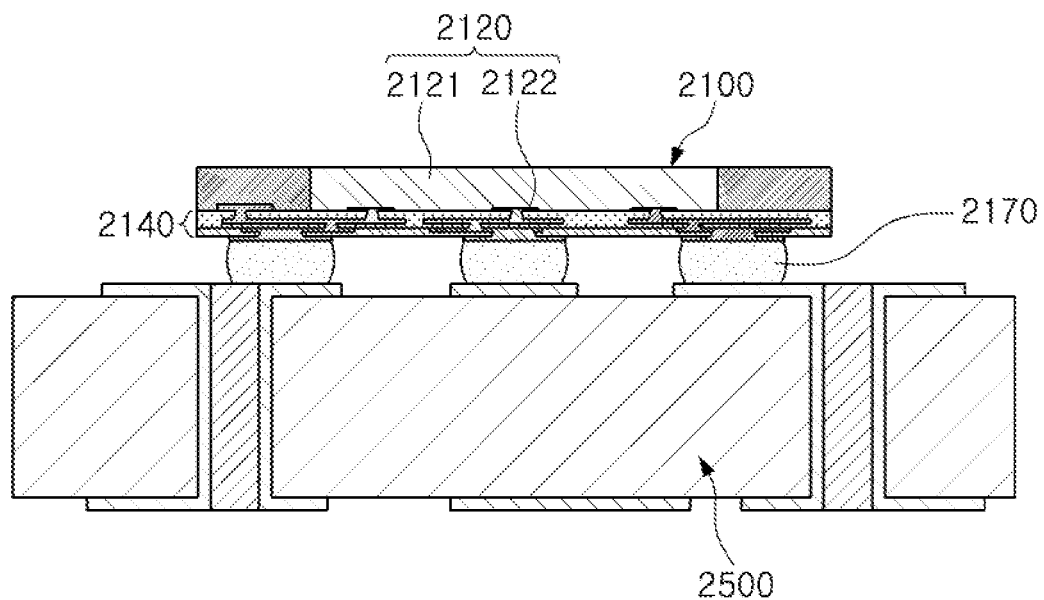
FIG. 21 is a schematic cross-sectional view illustrating a fan-out semiconductor package mounted on a main board of an electronic device.

FIG. 21 is a schematic cross-sectional view illustrating a fan-out semiconductor package mounted on a mainboard of an electronic device.

Referring to FIG. 21, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

As set forth above, according to the exemplary embodiments, the antenna module may be easily miniaturized while improving transmission and reception performance of the RF signal using the dielectric layer providing the environment capable of easily securing antenna performance.

While exemplary embodiments have been shown and described above, it will be apparent to those skilled in the art that modifications and variations could be made without departing from the scope of the present invention as defined by the appended claims.

What is claimed is:

1. An antenna module comprising:
a connection member including at least one wiring layer and at least one insulating layer;
an integrated circuit (IC) disposed on a first surface of the connection member and electrically connected to the at least one wiring layer;
a support member including at least one core via disposed on the first surface of the connection member to surround the IC and electrically connected to a corresponding wire of the at least one wiring layer;
a core plating member disposed on side surfaces of the support member to surround side surfaces of the IC;
an encapsulant disposed on the first surface of the connection member and encapsulating at least a portion of each of the IC and the support member;
a dielectric layer disposed on a second surface of the connection member;
a plurality of antenna members each disposed in the dielectric layer and configured to transmit or receive a radio frequency (RF) signal;
a plurality of feed vias disposed in the dielectric layer so that one end of each feed via is electrically connected to a corresponding antenna member of the plurality of antenna members and another end of each feed via is electrically connected to a corresponding wire of the at least one wiring layer; and
a plating member disposed in the dielectric layer to surround side surfaces of the plurality of feed vias,
wherein the dielectric layer has a dielectric constant greater than a dielectric constant of at least one insulating layer.

2. The antenna module of claim 1, wherein the second surface of the connection member having the dielectric layer thereon has roughness rougher than a roughness of the first surface of the connection member having the IC thereon.

3. The antenna module of claim 1, wherein a thickness of a wiring layer of the connection member is thicker at a location closer to a corresponding feed via of the plurality of feed vias than at another location further from the corresponding feed via.

4. The antenna module of claim 1, wherein the dielectric layer has a height greater than a height of the at least one insulating layer.

5. The antenna module of claim 1, further comprising:
a plurality of electrical connection structures connecting between the another end of a corresponding feed via of the plurality of feed vias and the corresponding wire of the at least one wiring layer,
wherein the plating member extends along the second surface of the connection member.

6. The antenna module of claim 1, further comprising:
at least one directional antenna member disposed to be closer to side surfaces of the dielectric layer than the plurality of antenna members in the dielectric layer, and positioned to extend in a direction from the at least one wiring layer toward the dielectric layer and to transmit or receive a second RF signal.

7. The antenna module of claim 1, further comprising:
an encapsulation member disposed on the dielectric layer; and
a plurality of director members each disposed between a corresponding antenna member of the plurality of antenna members and the encapsulation member in the dielectric layer.

8. The antenna module of claim 7, wherein the dielectric constant of the dielectric layer is greater than a dielectric constant of the encapsulation member, and
the at least one insulating layer has a dielectric constant smaller than the dielectric constant of the encapsulation member.

9. The antenna module of claim 1,
wherein the dielectric constant of the dielectric layer is greater than a dielectric constant of the encapsulant, and
the at least one insulating layer has a dielectric constant smaller than the dielectric constant of the encapsulant.

10. The antenna module of claim 1, wherein:
the encapsulant encapsulates at least a portion of the at least one core via.

11. The antenna module of claim 1, further comprising:
a passive component disposed on the first surface of the connection member and electrically connected to a corresponding wire of the at least one wiring layer
wherein the encapsulant encapsulates at least a portion of the passive component.

12. The antenna module of claim 1, wherein:
the support member provides an accommodation space; and
the antenna module further comprises a passive component disposed in the accommodation space and electrically connected to a corresponding wire of the at least one wiring layer.

13. The antenna module of claim 1, wherein the IC receives a base signal from the at least one core via and generates the RF signal of a millimeter wave (mmWave) band based on the base signal.

14. An antenna module comprising:
a dielectric layer having a plurality of antenna members disposed therein, each antenna member being electrically connected to a respective feed via extending from the antenna member to a first surface of the dielectric layer; and
a connection member disposed on the first surface of the dielectric layer, and including an insulating material having a plurality of wiring layers extending therethrough and connected to each of the respective feed vias of the plurality of antenna members,
wherein the dielectric layer has a dielectric constant greater than a dielectric constant of the insulating material of the connection member, and
the dielectric layer has at least one directional antenna member disposed to be closer to side surfaces of the dielectric layer than the plurality of antenna members in the dielectric layer, and positioned to extend in a direction from at least one of the plurality of wiring layers toward the dielectric layer and to transmit or receive a second RF signal.

15. The antenna module of claim 14, further comprising:
an encapsulation member disposed on a second surface of the dielectric layer different from the first surface,
wherein the dielectric constant of the dielectric layer is greater than a dielectric constant of the encapsulation member.

16. The antenna module of claim 15, further comprising:
a plurality of director members each disposed on the second surface of the dielectric layer between a corresponding antenna member of the plurality of antenna members and the encapsulation member; and
a plurality of plating members disposed between antenna members of the plurality of antenna members in the dielectric layer, each plating member formed of a conductive material and extending through a thickness of the dielectric layer from the first surface to the second surface of the dielectric layer.

17. The antenna module of claim 14, further comprising:
a passivation layer disposed on a surface of the connection member opposite to the dielectric layer, the passivation layer having a plurality of openings extending therethrough; and
a plurality of connection pads each disposed in a respective opening of the plurality of openings of the passivation layer to contact a wiring layer of the plurality of wiring layers of the connection member, wherein each connection pad is electrically connected to an antenna member of the plurality of antenna members through at least one wiring layer of the plurality of wiring layers of the connection member.

18. The antenna module of claim 17, further comprising:
an integrated circuit chip mounted to the surface of the connection member opposite to the dielectric layer, wherein the integrated circuit chip is electrically connected to the plurality of connection pads, and
an encapsulant encapsulating at least portions of the integrated circuit chip,
wherein the dielectric constant of the dielectric layer is greater than a dielectric constant of the encapsulant encapsulating at least portions of the integrated circuit chip.

19. An antenna module comprising:
a connection member including at least one wiring layer and at least one insulating layer;
an integrated circuit (IC) disposed on a first surface of the connection member and electrically connected to the at least one wiring layer;
a dielectric layer disposed on a second surface of the connection member;
a plurality of antenna members each disposed in the dielectric layer and configured to transmit or receive a radio frequency (RF) signal;
a plurality of feed vias disposed in the dielectric layer so that one end of each feed via is electrically connected to a corresponding antenna member of the plurality of antenna members and another end of each feed via is electrically connected to a corresponding wire of the at least one wiring layer;
a plating member disposed in the dielectric layer to surround side surfaces of the plurality of feed vias;
at least one directional antenna member disposed to be closer to side surfaces of the dielectric layer than the plurality of antenna members in the dielectric layer, and positioned to extend in a direction from the at least one wiring layer toward the dielectric layer and to transmit or receive a second RF signal;
a first encapsulation member disposed on the dielectric layer;
a plurality of director members each disposed between a corresponding antenna member of the plurality of antenna members and the first encapsulation member in the dielectric layer;
a second encapsulant encapsulating at least a portion of the IC;
a support member including at least one core via disposed on the first surface of the connection member to surround the IC and electrically connected to a corresponding wire of the at least one wiring layer; and
a core plating member disposed on side surfaces of the support member to surround side surfaces of the IC,
wherein the dielectric layer has a dielectric constant greater than a dielectric constant of at least one insulating layer,
the dielectric constant of the dielectric layer is greater than a dielectric constant of the second encapsulant, and
the dielectric constant of the at least one insulating layer is smaller than the dielectric constant of the second encapsulant.

* * * * *